(12) United States Patent
Gu et al.

(10) Patent No.: US 11,769,344 B2
(45) Date of Patent: *Sep. 26, 2023

(54) PATTERN IDENTIFICATION DEVICE AND DISPLAY APPARATUS

(71) Applicant: BOE TECHNOLOGY GROUP CO., LTD., Beijing (CN)

(72) Inventors: Pinchao Gu, Beijing (CN); Haisheng Wang, Beijing (CN); Chunwei Wu, Beijing (CN); Yingming Liu, Beijing (CN); Rui Xu, Beijing (CN); Changfeng Li, Beijing (CN); Lijun Zhao, Beijing (CN); Yanan Jia, Beijing (CN); Yuzhen Guo, Beijing (CN); Yunke Qin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/804,474

(22) Filed: May 27, 2022

(65) Prior Publication Data

US 2022/0292798 A1 Sep. 15, 2022

Related U.S. Application Data

(63) Continuation of application No. 16/343,768, filed as application No. PCT/CN2018/100270 on Aug. 13, 2018, now Pat. No. 11,373,386.

(30) Foreign Application Priority Data

Jan. 30, 2018 (CN) .......................... 201810090793.9

(51) Int. Cl.
*G06V 10/147* (2022.01)
*H01L 27/32* (2006.01)
(Continued)

(52) U.S. Cl.
CPC ......... *G06V 40/1318* (2022.01); *H10K 59/65* (2023.02); *G06V 40/16* (2022.01)

(58) Field of Classification Search
CPC ..... H01L 27/3234; H01L 27/28; H01L 27/15; H01L 27/32; H01L 27/3202;
(Continued)

(56) References Cited

U.S. PATENT DOCUMENTS

2005/0253788 A1* 11/2005 Benoit ................. H10K 50/858
345/76
2012/0300989 A1* 11/2012 Nakashima ........ G06V 40/1324
382/115

(Continued)

*Primary Examiner* — Edward F Urban
*Assistant Examiner* — Duy Tran
(74) *Attorney, Agent, or Firm* — SYNCODA LLC; Feng Ma

(57) ABSTRACT

A device for identifying a pattern over a first surface includes a photosensitive layer, and a light-guiding layer disposed between the photosensitive layer and the first surface. The photosensitive layer includes a plurality of photosensitive elements, each configured to convert incident light into an electrical signal. The light-guiding layer includes a plurality of light-guiding units, each positionally corresponding to one of the plurality of photosensitive elements. Each light-guiding unit include a plurality of light-transmitting portions, each configured to guide a light beam reflected from a feature of the pattern positionally corresponding thereto to transmit therethrough and reach one of the plurality of photosensitive elements corresponding to the each of the plurality of light-guiding units. The device can be used for identification of fingerprint, as well as other biometric or non-biometric features, and has a reduced thickness and an improved accuracy for pattern identification.

17 Claims, 13 Drawing Sheets

(51) Int. Cl.
*G06V 10/145* (2022.01)
*G06V 40/13* (2022.01)
*H10K 59/65* (2023.01)
*G06V 40/16* (2022.01)

(58) Field of Classification Search
CPC ............ H01L 27/3204; H01L 27/3225; G06V 10/147; G06V 30/1429; G06V 30/1437; G06V 40/13; G06V 40/145; G06V 40/1318; G06V 10/145; G06V 40/16; G06V 40/10; G06K 9/00
See application file for complete search history.

(56) References Cited

U.S. PATENT DOCUMENTS

| | | | |
|---|---|---|---|
| 2015/0042934 A1* | 2/2015 | Kanno | G02B 5/0247 |
| | | | 349/112 |
| 2016/0254312 A1* | 9/2016 | Lee | H01L 27/14687 |
| | | | 382/125 |
| 2017/0017824 A1* | 1/2017 | Smith | G02B 6/005 |
| 2017/0103248 A1* | 4/2017 | Yamamoto | H01L 27/14649 |
| 2017/0161540 A1* | 6/2017 | Mienko | H01L 31/02325 |

* cited by examiner

PATTERN IDENTIFICATION DEVICE AND DISPLAY APPARATUS

CROSS-REFERENCE TO RELATED APPLICATIONS

This is a continuation of U.S. patent application Ser. No. 16/343,768 filed on Apr. 21, 2019, which is a national stage entry of International Application No. PCT/CN2018/100270 filed on Aug. 13, 2018, which claims priority to Chinese Patent Application No. 20180090793.9 filed on Jan. 30, 2018 and Chinese Patent Application No. 201710251094.3 filed on Apr. 17, 2017. The disclosures of the above-referenced applications are hereby incorporated by reference in their entirety.

BACKGROUND

Human fingerprints are generally unique and invariable. Fingerprint identification technologies can have advantages of good security and high reliability, and therefore are widely used in various applications to secure personal information, especially in display apparatuses, such as TV sets, mobile phones, laptop computers, and tablet computers, etc.

SUMMARY

The present disclosure relates to electronic security devices, and more specifically to a pattern identification device and a display apparatus.

In current technologies, a fingerprint identification module can be included in a display apparatus to secure the display apparatus by having the display apparatus equipped with the fingerprint identification function. The inventors of the present disclosure have recognized that the conventional fingerprint identification module provided in the display apparatus generally has a large thickness and does not meet the trend of development of the display apparatus. Therefore, various embodiments of the present disclosure are devised to reduce the thickness of the fingerprint identification module.

The present disclosure aims to solve at least one of the technical problems existing in the current technology and proposes a fingerprint identification device and a display apparatus.

In order to achieve the above object, the present disclosure provides a pattern identification device, which can be used for identifying a pattern over a first surface thereof. The pattern identification device comprises a photosensitive layer, and a light-guiding layer disposed between the photosensitive layer and the first surface.

The photosensitive layer comprises a plurality of photosensitive elements, each configured to convert a light shedding thereon into an electrical signal. The light-guiding layer comprises a plurality of light-guiding units, each positionally corresponding to one of the plurality of photosensitive elements.

Each of the plurality of light-guiding units comprises a plurality of light-transmitting portions, each configured to guide a light beam reflected from a feature of the pattern positionally corresponding thereto to transmit therethrough and reach one of the plurality of photosensitive elements corresponding to the each of the plurality of light-guiding units.

According to some embodiments of the pattern identification device, each of the plurality of light-transmitting portions comprises a through-hole surrounded by at least one light-shielding portion.

Herein, an angle of the light beam transmitting through the each of the plurality of light-transmitting portions and reaching the one of the plurality of photosensitive elements corresponding to the each of the plurality of light-guiding units relative a plane substantially perpendicular to the through-hole can be within a range of about 88.8°-90°.

According to some other embodiments of the pattern identification device, each of the plurality of light-transmitting portions comprises an optical fiber.

The pattern identification device can further include a transparent cover, disposed between the light-guiding layer and the first surface. It can be further configured such that a cross-sectional shape of the through-hole in the each of the plurality of light-transmitting portions in a plane parallel to the transparent cover is circular.

In the pattern identification device described above, a diameter of the circular cross-section of the through-hole in the each of the plurality of light-transmitting portions can be denoted by d, a minimum distance between central points of two adjacent through-holes corresponding to different photosensitive elements can be denoted by L1, a distance between the surface of the transparent cover opposing to the photosensitive layer and a surface of the light-guiding layer facing the transparent cover can be denoted by a, and a thickness of the light-guiding layer can be denoted by h. The relationship between these parameters shall satisfy:

$$h \geq \frac{2ad}{L1-d}.$$

In the pattern identification device, a maximum distance of center points of two adjacent through-holes in a row or a column and corresponding to a same photosensitive element is denoted by L2, and a relationship L2<L1 can be satisfied according to some embodiments of the disclosure.

According to some embodiments of the pattern identification device, each photosensitive element corresponds to nine through-holes arranged in a 3×3 array, distances between center points of any two adjacent through-holes in a row or column of the 3×3 array are substantially equal; and distances between center points of any two adjacent through-holes corresponding to difference photosensitive elements and in a row or in a column are substantially equal.

In certain embodiments of the pattern identification device described above, a diameter of the circular cross-section of each through-hole can be about 3.0-4.2 µm, the distance between the center points of two adjacent through-holes corresponding to different photosensitive elements and in a column or in a row can be in a range of about 17.8-35.1 µm, the distance between the surface of the transparent cover opposing to the photosensitive layer and the surface of the light-guiding layer facing the transparent cover can be about 900-1060 µm, and a thickness of the light-guiding layer can be in a range of about 174.5-498.5 µm.

In certain embodiments of the pattern identification device described above, a diameter of the circular cross-section of each through-hole can be about 6.0-7.4 µm, the distance between the center points of two adjacent through-holes corresponding to different photosensitive elements and in a column or in a row can be in a range of about 33.0-35.9 µm, the distance between the surface of the transparent cover opposing to the photosensitive layer and the surface of the light-guiding layer facing the transparent cover can be about 900-1060 µm, and a thickness of the light-guiding layer can be in a range of about 423.7-498.5 µm.

According to some other embodiments of the pattern identification device, each photosensitive element corresponds to twenty-five through-holes arranged in a 5×5 array, distances between center points of any two adjacent through-holes in a row or in a column of the 5×5 array are substantially equal, and distances between center points of any two adjacent through-holes corresponding to difference photosensitive elements and in a row or in a column are substantially equal.

In certain embodiments of the pattern identification device described above, a diameter of the circular cross-section of each through-hole can be about 4.50-5.80 µm, a distance between the center points of two adjacent through-holes corresponding to different photosensitive elements and in a column or in a row can be in a range of about 25.4-29.0 µm, a distance between the surface of the transparent cover opposing to the photosensitive layer and the surface of the light-guiding layer facing the transparent cover can be about 900-1060 µm, and a thickness of the light-guiding layer can be in a range of about 423.7-498.5 µm.

The pattern identification device can be used for identification of a pattern including at least one of a biometric feature or a non-biometric feature. The biometric feature includes a fingerprint, and a palm print, or a facial feature.

In another aspect, the disclosure further provides a display apparatus, which can include at least one pattern identification device.

Herein the display apparatus can further include a display panel. The display panel is disposed over the light-guiding layer and below the first surface, with a light-emitting side and a non-light-emitting side thereof facing the first surface and the light-guiding layer, respectively. The display panel is configured such that a portion thereof positionally corresponding to each of the plurality of photosensitive elements is light-transmissive such that lights from the display panel can, upon reflection by the pattern over the first surface, transmit through the portion of the display panel to reach the each of the plurality of photosensitive elements.

According to some embodiments, the display panel is an OLED display panel.

In the display apparatus, the portion of the display panel can comprise at least one transparent pixel electrode allowing the portion to be light-transmissive.

According to some embodiments of the display apparatus, the portion of the display panel includes one transparent pixel electrode, yet according to some other embodiments, the portion of the display panel includes more than one transparent pixel electrode.

In the display apparatus, the portion of the display panel can be provided with at least one second through-hole allowing the portion to be light-transmissive.

The display apparatus can further include a transparent cover disposed between the light-guiding layer and the first surface. The transparent cover is configured to be common to both the display panel and the pattern identification device.

Herein, the photosensitive layer and the light-guiding layer of the pattern identification device can be arranged across a whole screen of the display apparatus.

In summary, in the present disclosure, a fingerprint identification device and a display apparatus are provided in various embodiments. The fingerprint identification device is divided into a plurality of identification regions arranged in an array.

The fingerprint identification device includes a photosensitive layer and a light-guiding layer. The photosensitive layer includes a plurality of photosensitive elements in a one-to-one correspondence with the identification regions. The photosensitive element is configured to perform photoelectric conversion on incident light. The light-guiding layer is located on a light incident side of the photosensitive layer and defines an angle between a light beam reaching the photosensitive element and a plane where the photosensitive element is located to be within a preset range.

The light-guiding layer includes a light-shielding portion and a plurality of the light-transmitting portions. The plurality of the light-transmitting portions are disposed in each region corresponding to a photosensitive element.

In the technical solution of the present disclosure, the cross-section area of each light-transmitting portion can be reduced by corresponding one photosensitive element to a plurality of light-transmitting portions, thus the thickness of the light-guiding layer can be reduced accordingly, which is advantageous for the thinning of the fingerprint recognition device. In addition, increasing the number of light-transmitting portions can improve the amount of light transmitted, which further improves the identification accuracy.

BRIEF DESCRIPTION OF THE DRAWINGS

To more clearly illustrate some of the embodiments, the following is a brief description of the drawings.

The drawings in the following descriptions are only illustrative of some embodiments. For those of ordinary skill in the art, other drawings of other embodiments can become apparent based on these drawings.

DETAILED DESCRIPTION

In the following, with reference to the drawings of the embodiments disclosed herein, the technical solutions of various embodiments of the present disclosure will be described in a clear and fully understandable way.

It is noted that the described embodiments are merely some but not all of the embodiments of the invention. Based on the described embodiments of the invention, those ordinarily skilled in the art can obtain other embodiment(s), which come(s) within the scope sought for protection by the invention.

Figure 1:
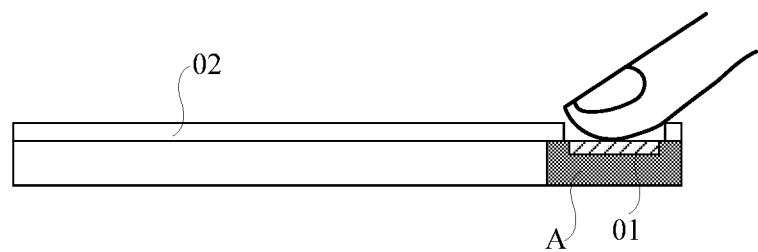
FIG. 1 is a display apparatus having a fingerprint identification device according to an existing technology.

In order to allow a display apparatus to have a functionality of fingerprint identification, a fingerprint identification device 01 is typically arranged in a non-display region A of the display apparatus, as illustrated in FIG. 1. When a finger touches a cover glass 02 at a position corresponding to the fingerprint identification device 01, the fingerprint identification device 01 can be utilized for identification of the fingerprint. Because the presence of the cover glass 02 increases the distance from the finger to the fingerprint identification device 01, the accuracy for fingerprint identification is reduced.

In order to address the above issue, based on existing fingerprint technologies, a touch hole is commonly arranged in the cover glass 02 at the position corresponding to the fingerprint identification device 01, allowing the finger to touch the fingerprint identification device 01 therethrough with an increased identification accuracy. Such an arrangement of a touch hole, however, requires a cutting process during the manufacturing of the display apparatus, which can reduce the product yield and increase the manufacturing cost.

In a first aspect, the disclosure provides a pattern identification device, which can be utilized in a display apparatus for identification of biometric features, such as a fingerprint, a palm print, facial features, etc., or identification of non-biometric features, such as a key or a key card. Throughout the disclosure, the pattern identification device is described in detail with primarily fingerprint identification as illustrating example.

Figure 2:
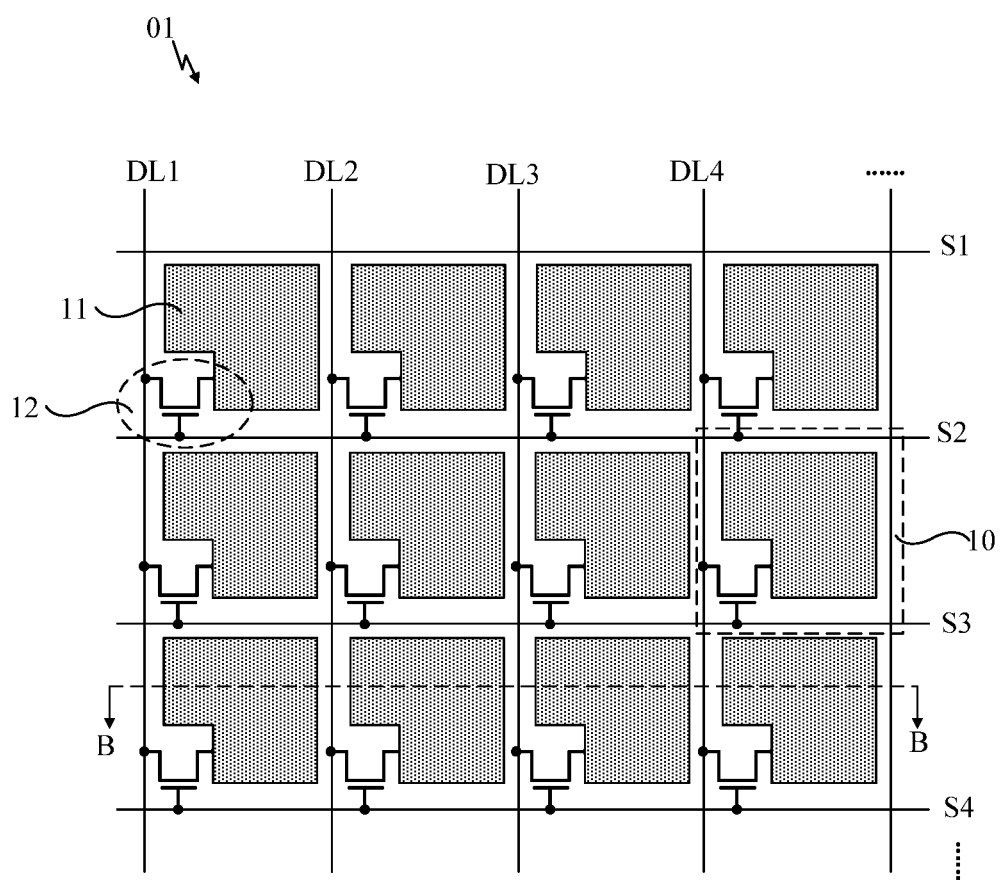
FIG. 2 shows a structural diagram of a fingerprint identification device according to some embodiments of the disclosure.

FIG. 2 shows a fingerprint identification device 01, which includes a plurality of identification units 10. Each identification unit 10 includes a photosensitive element 11, configured to convert a light shedding thereon into an electrical signal.

The fingerprint identification device 01 further includes a plurality of scan lines (S1, S2, S3, S4, . . . ) and a plurality of data lines (DL1, DL2, DL3, DL4, . . . ), which are arranged to cross with one another to thereby define the plurality of identification units 10.

Each identification unit 10 is provided with a switching transistor 12, with a first electrode thereof electrically coupled to a data line (e.g. DL1), a gate electrode thereof electrically coupled to a scan line (e.g. S1), and a second electrode thereof electrically coupled to one photosensitive element 11.

Figure 3:
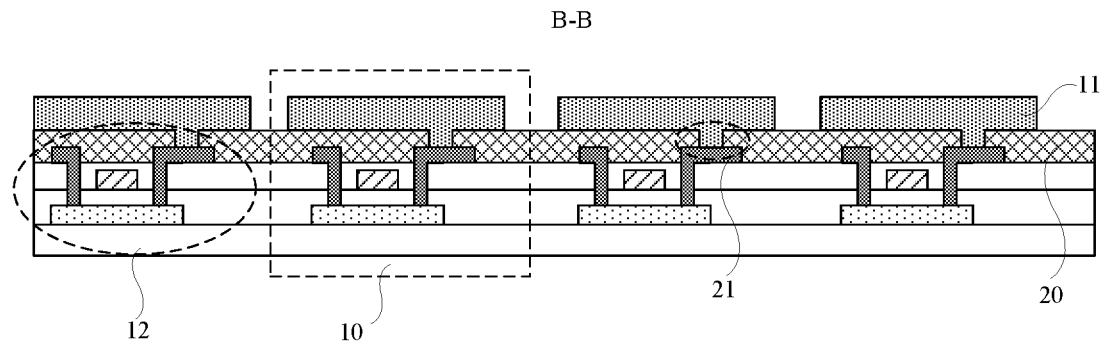
FIG. 3 is a cross-sectional view of the fingerprint identification device shown in FIG. 2 along the B-B line.

It is noted that the first electrode and the second electrode of the switching transistor 12 can be a source electrode and a drain electrode respectively, or can be a drain electrode and a source electrode respectively. There is no limitation to the type of the switching transistor 12. It can be a top-gate thin-film transistor as illustrated in FIG. 3, or can be a bottom-gate thin-film transistor. The switching transistor 12 can be of an N-type thin-film transistor or of a P-type thin-film transistor.

In order to increase the area for receiving lights in the photosensitive element 11 to thereby increase its photoelectric conversion efficiency, as shown in FIG. 3, the photosensitive element 11 can be configured to completely cover the switching transistor 12 that is electrically coupled thereto. An insulating layer 20 is arranged between the photosensitive element 11 and the switching transistor 12. The insulating layer 20 is further provided with a via 21 at a position corresponding to the second electrode of the switching transistor 12. The via 21 is configured to allow an electrical connection between the photosensitive element 11 and the second electrode of the switching transistor 12 and therethrough.

Figure 4:
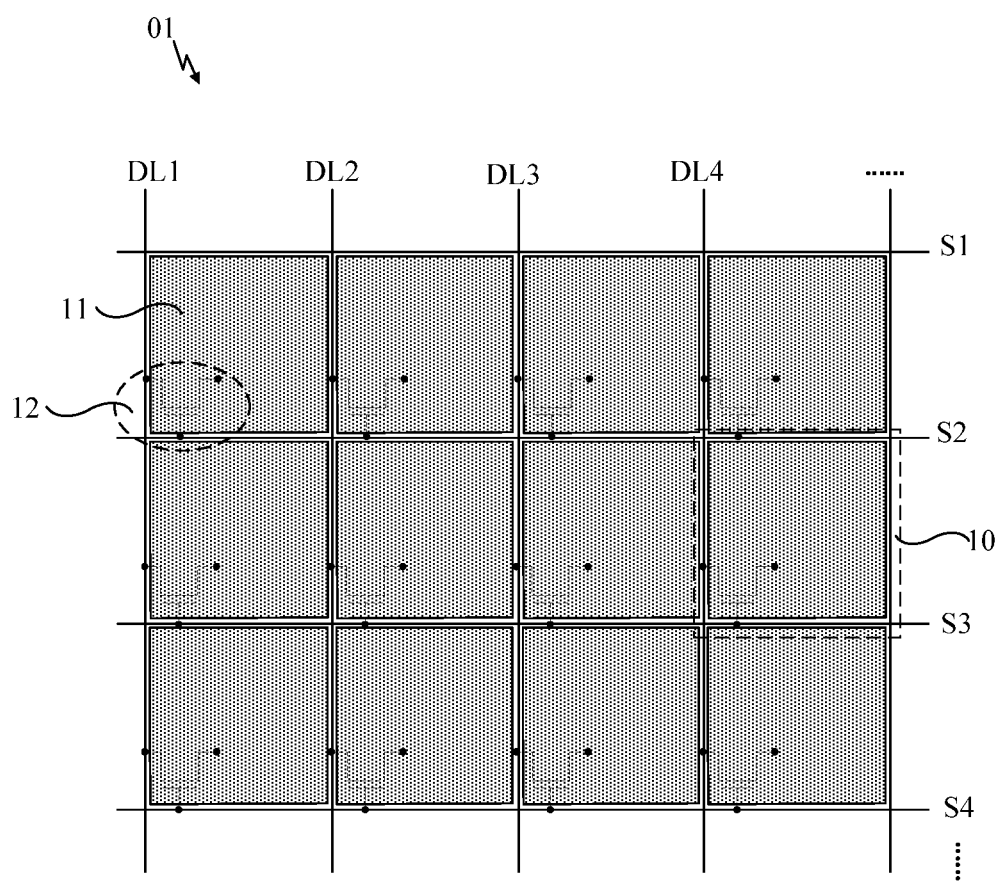
FIG. 4 shows a structural diagram of a fingerprint identification device according to some other embodiments of the disclosure.

On the above basis, in order to further increase the area for receiving lights in the photosensitive element 11, as illustrated in FIG. 4, an area of the photosensitive element 11 can be configured to be substantially same as an opening area of the identification unit 10, and a shape of the photosensitive element 11 can be configured to be substantially same as a shape of the identification unit 10.

Herein the opening area of the photosensitive element 11 is referred to as the area defined by the scan lines (e.g. S1 and S2) and the data lines (e.g. DL1 and DL2). In the embodiments as shown in FIG. 2 and FIG. 4, the plurality of scan lines are substantially parallel to one another, the plurality of data lines are also substantially parallel to one another, and any scan line and any data line is further configured to be substantially perpendicular to each other, therefore, the opening of the identification unit 10 has a shape of a rectangle, as illustrated in both FIG. 2 and FIG. 4.

Figure 5:
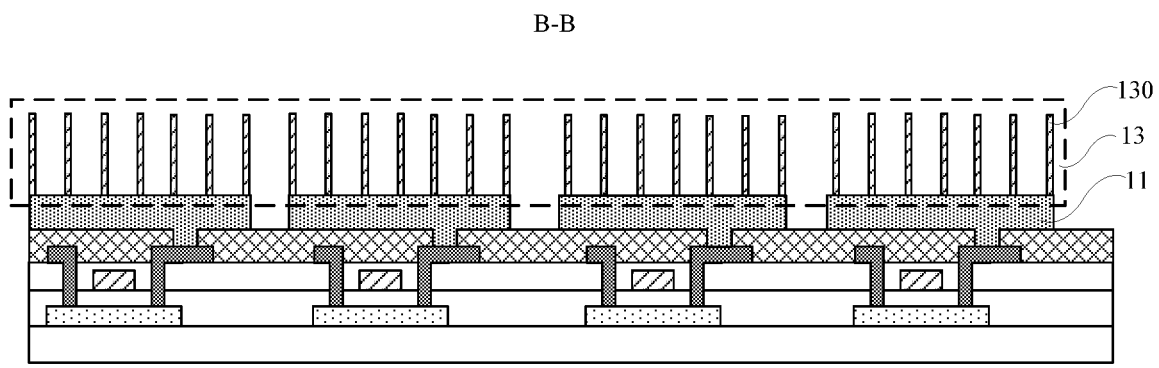
FIG. 5 is a cross-sectional view of the fingerprint identification device shown in FIG. 4 along the B-B line.

As shown in FIG. 5, the fingerprint identification device 01 further includes a light-guiding layer 13 disposed over a light-incident side of the photosensitive element 11. The light-guiding layer comprises a plurality of light-guiding units, each positionally corresponding to one of the plurality of photosensitive elements. Each of the plurality of light-guiding units comprises a plurality of light-transmitting portions, each configured to guide a light beam reflected from a feature of the pattern positionally corresponding thereto to transmit therethrough and reach one of the plurality of photosensitive elements corresponding to the each of the plurality of light-guiding units.

According to some embodiments as illustrated in FIG. 5, the light-guiding layer 13 comprise a plurality of light-guiding bars 130 which are arranged to be parallel to one another and can comprise a light-shielding material.

As illustrated in FIG. 5, in the fingerprint identification device disclosed herein, by means of the plurality of light-guiding bars 130 in the light-guiding layer 13, lights reflected from a finger can transmit through an extension direction of a gap between every two neighboring light-guiding bars 130 before shedding onto the photosensitive element 11. Such an arrangement reduces the chance of interference between lights transmitting through two adjacent gaps. It is noted that in these embodiments of the fingerprint identification device, the plurality of light-transmitting portions are substantially the gaps formed between any two adjacent guiding bars 130.

It should be noted that in the light-guiding layer, each of the plurality of light-transmitting portions can have other configurations. According to some other embodiments (e.g. those illustrated in FIG. 14 which will be described below), each of the plurality of light-transmitting portions can be a through-hole surrounded by at least one light-shielding portion. According to yet some other embodiments, each of the plurality of light-transmitting portions can comprise a light-guiding material such as an optical fiber.

In the fingerprint identification device, the configuration of the light-guiding layer 13 can reduce the chance of interference between lights respectively shedding onto two adjacent photosensitive elements, and in turn, the fingerprint identification accuracy for the device can be further elevated. The working principle as such, as well as its improvement to further increase the fingerprint identification accuracy, will be described in detail in a second aspect the disclosure that follows.

According to some embodiments, a total of two fingerprint identification devices 01 can be arranged in a display apparatus. Whereas a first fingerprint identification device can be employed to receive light beams reflected from lights emitted from the display apparatus, a second fingerprint identification device can be employed to receive light beams from an environment.

Herein, the display apparatus can be an organic light emitting diode (OLED) display apparatus, and preferably, the OLED display apparatus is of a top-emitting type.

Figure 6:
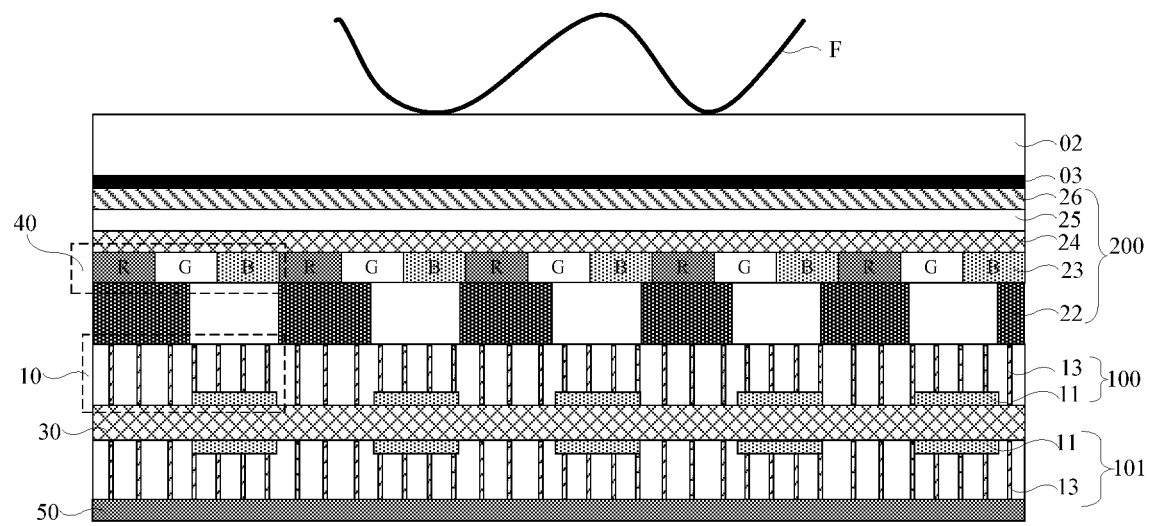
FIG. 6 shows a structural diagram of a display apparatus having two fingerprint identification devices according to some embodiments of the disclosure.

Specifically, as illustrated in FIG. 6, the OLED display apparatus comprises a display panel 200. The display panel 200 includes a display backplane 22, and further includes, over the display backplane 22, an organic functional layer 23 (including a hole injection sub-layer, a hole transmission sub-layer, a light emitting sub-layer, an electronic transmission sub-layer, an electronic injection sub-layer, a color filter sub-layer, etc.), a cathode 24, a polarizing film 25, and a packaging film layer 26 (i.e. a packaging cover plate). In addition, the OLED display apparatus further includes a cover glass 02, which is bonded with the display panel 200 through an adhesive layer 03 that has a composition of an optical adhesive.

The first fingerprint identification device 100 is arranged in a display region of the OLED display apparatus, and is specifically arranged over a non-light-emitting surface of the display panel 200. In order to ensure that the lights reflected by a finger can be transmitted to the photosensitive element 11 of the first fingerprint identification device 100, the display panel 200 is configured such that a portion of the display panel 200 that positionally correspond to the photosensitive element 11 in the first fingerprint identification device 100 is transmissive to lights.

As such, it can be configured such that no data lines, transistors, capacitors, or other electronic components are not arranged in the portion of the display panel 200 that positionally correspond to the photosensitive element 11 in the first fingerprint identification device 100 so as to allow the lights reflected by the finger can transmit through this substantially light-transmissive portion of the display panel 200 to thereby be able to reach the photosensitive element 11 of the first fingerprint identification device 100.

Alternatively, it can be configured such that one or more vias or through-holes can be arranged in the portion of the display panel 200 that positionally correspond to the photosensitive element 11 in the first fingerprint identification device 100 so as to allow the lights reflected by the finger can transmit through the vias or through-holes to thereby be able to reach the photosensitive element 11 of the first fingerprint identification device 100.

Furthermore, the light-guiding layer 13 in the first fingerprint identification device 100 is further configured to be next to the display panel 200. As such, during fingerprint identification, the lights emitted from the display panel 200 of the OLED display apparatus are only transmitted to a side of the display panel 200 that is far from the first fingerprint identification device 100. As specifically shown in FIG. 6, when a finger F touches the cover glass 02, the lights emitted by the display panel 200 of the OLED display device are irradiated on the finger F, and the finger F can then reflect the lights so that the first fingerprint identification device 100 can receive the reflected light.

Although the first fingerprint identification device 100 is arranged over the non-light-emitting surface of the display panel 200 so that the finger F does not directly contact the first fingerprint identification device 100, the reflected lights can pass through the light-guiding layer 13 and subsequently enter the photosensitive element 11 in a vertically and parallel manner.

Consequently, the dispersion of finger F-reflected lights can be reduced, and a majority of the reflected lights can still be able to enter the first fingerprint identification device 100, which in turn ensures the efficiency and accuracy of fingerprint recognition, thereby improving the clarity of fingerprint images that are thus collected.

As such, by means of the first fingerprint identification device 100 described above when a user's finger F touches the cover glass 02, the operations related to fingerprint recognition, such as unlocking, and payment by fingerprint, etc., can be realized.

It is noted that the materials which can constitute the above photosensitive element 11 can include an organic photoelectric conversion material or an inorganic photoelectric conversion material. There are no limitations herein.

However, because the lights reflected by the finger F is about half of the light emitted by the display panel of the OLED display apparatus. After the lights reflected by the finger F sequentially pass through the cover glass 02, the adhesive layer 03, the display panel 200, the light incident onto the photosensitive element 11 is usually about 4% of the lights emitted from the display panel of the OLED display device. Therefore, in order to improve the accuracy of fingerprint detection, it is preferable that the material constituting the photosensitive element 11 can comprise an organic photoelectric conversion material with a relatively high photoelectric conversion efficiency.

As further illustrated in FIG. 6, the display panel 200 includes a plurality of pixel units 40. Each pixel unit 40 includes at least three sub-pixels, such as a red sub-pixel, a green sub-pixel, and a blue sub-pixel.

It can be configured such that each pixel unit 40 positionally and functionally correspond to one identification unit 10. As such, if the resolution of the OLED display apparatus is increased, the pixel per inch (PPI) of the OLED display apparatus increases, and the number of pixel units 40 increases, thus the number of identification units 10 also increases, in turn improving the accuracy of the fingerprint recognition.

It is noted that according to some embodiments, each identification unit 10 can be configured to correspond to more than one pixel units (e.g. 3 pixel units, or 4 pixel units). These embodiments of the display apparatus have a reduced manufacturing cost.

Figure 7:
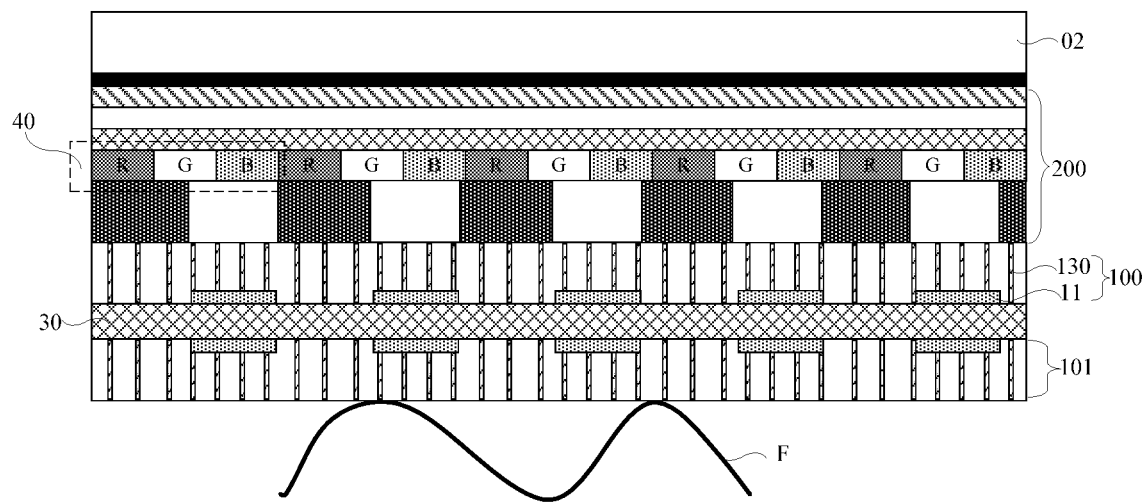
FIG. 7 shows a structural diagram of a display apparatus having two fingerprint identification devices according to some other embodiments of the disclosure.

As further illustrated in FIG. 6 or FIG. 7, the second fingerprint identification device 101 can be further arranged over a non-light-emitting surface of the display panel 200. In the second fingerprint identification device 101, a light-guiding layer 13 thereof is arranged at a side of the second fingerprint identification device 101 that is far away from the display panel 200 and is close to the environment.

As such, when the second fingerprint identification device 101 is disposed in an environment with lights, lights from the environment can, after passing through the light-guiding layer 13 of the second fingerprint identification device 101, all enter onto the photosensitive elements 11, which thereby read a whit light for the whole second fingerprint identification device 101.

As further illustrated in FIG. 7, when a finger F touches the second fingerprint identification device 101, the finger F destroys the full reflection of the environmental light in the second fingerprint identification device 101. The environment lights within the second fingerprint identification device 101 irradiate the finger F, and the reflected lights then enter onto the various photosensitive elements 11 through the light-guiding layer 13. By means of different light sensitive element 11 to receive lights with different intensities that are reflected by the ridges and valleys of the fingerprint, the fingerprint of the finger F can be detected.

Since the above fingerprint detection process is carried out by using environmental light, there is no restriction on whether the display panel 200 emits lights. Therefore, when the fingerprint identification is realized by means of the second fingerprint identification device 101, the display panel 200 does not need to be turned on to display images.

As such, when the fingerprint detected by the second fingerprint identification device 101 is consistent with the fingerprint stored in the OLED display apparatus, a screen wake-up function for the OLED display apparatus can be realized such that the display panel 200 of the OLED display apparatus can emit lights for displaying images. When waking up the screen, a user can arrange the OLED display apparatus to face the light-emitting side thereof while touching his finger F onto the second fingerprint identification device 101, which is arranged at a non-light-emitting side of the OLED display apparatus.

Furthermore, once the OLED display apparatus waken up, the user can perform other operations related to fingerprint recognition, such as unlocking, and payment by fingerprint, etc., by means of the first fingerprint identification device 100 or the second fingerprint identification device 101.

As further illustrated in FIG. 6, a retractable cover plate 50 can be further arranged in the OLED display apparatus, which can be specifically arranged over a light-incident side of the second fingerprint identification device 101 that is configured for allowing the environmental lights thereinto. The retractable cover plate 50 can cover the second fingerprint identification device 101 to prevent the unwanted environmental lights from influencing the second fingerprint identification device 101, while the retractable cover plate 50 can also be retracted to thereby expose the second fingerprint identification device 101 for fingerprint identification when needed. It is noted that there is no limitation to the configuration approaches for arranging the retractable cover plate 50, which can be, for example, be assembled with a back cover (not shown) in a retraction-operable manner.

According to some embodiments, the first fingerprint identification device 100 and the second fingerprint identification device 101 can be configured to correspond to each other positionally, as illustrated in FIG. 6 and FIG. 7. A carrier substrate 30, of a transparent material such as glass or resin, can be disposed between the first fingerprint identification device 100 or the second fingerprint identification device 101.

On the one hand, because the first fingerprint identification device 100 has a relatively longer distance from the finger F, in order to increase the accuracy for fingerprint identification using the first fingerprint identification device 100, the plurality of light-transmitting portions in the light-guiding layer 13 in the first fingerprint identification device 100 can comprise optical fibers, each having a diameter of 0.001~0.2.

On the other hand, because the second fingerprint identification device 101 has a relatively shorter distance from the finger F, the optical fibers used for forming the plurality of light-transmitting portions in the light-guiding layer 13 in the second fingerprint identification device 101 can have a relatively larger diameter, for example a diameter of 0.8-1. As such, the amount of lights that can enter onto the photosensitive elements 11 of the second fingerprint identification device 101 can be increased, and the photosensitive elements 11 can have a relatively low photoelectric conversion efficiency to thereby result in a reduced manufacturing cost.

In addition, the optical fibers for the plurality of light-transmitting portions in the light-guiding layer 13 in both the first fingerprint identification device 100 and the second fingerprint identification device 101 can have a diameter of 6 μm~80 μm, so as to meet the requirement for any type of the OLED display apparatus.

Figure 8:
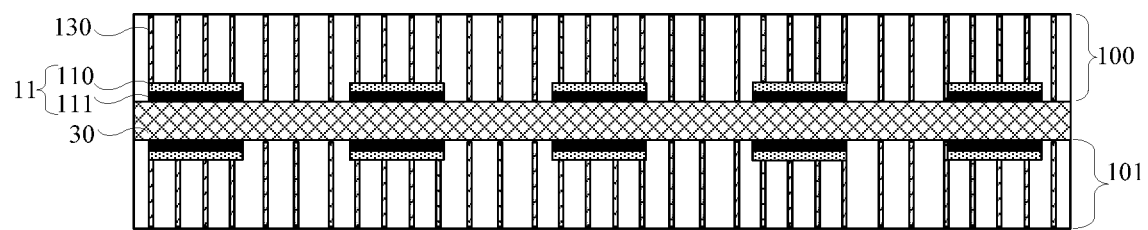
FIG. 8 shows a structural diagram of the two fingerprint identification devices shown in FIG. 6 or FIG. 7 according to yet a different embodiment of the disclosure.

Furthermore, in embodiments of the OLED display apparatus where the first fingerprint identification device 100 and the second fingerprint identification device 101 positionally correspond to each other, in order to prevent the interference between the first fingerprint identification device 100 and the second fingerprint identification device 101, each photosensitive element 11 in each of the first fingerprint identification device 100 and the second fingerprint identification device 101 can be configured to include a photoelectric conversion layer 110 and a shielding layer 111, and the shielding layer 111 in each case is arranged to be relatively closer to the carrier substrate 30 than the photoelectric conversion layer 110, as illustrated in FIG. 8.

As such, the lights entering onto the photoelectric conversion layer 110 of the first fingerprint identification device 100 do not enter the photoelectric conversion layer 110 of the second fingerprint identification device 101 under the action of the shielding layer 111 of the first fingerprint identification device 100.

Similarly, the lights entering onto the photoelectric conversion layer 110 of the second fingerprint identification device 101 do not enter the photoelectric conversion layer 110 of the first fingerprint identification device 100 under the action of the shielding layer 111 of the second fingerprint identification device 101.

Herein the material for the photoelectric conversion layer 110 of each of the first fingerprint identification device 100 and the second fingerprint identification device 101 can be an organic or an inorganic photoelectric conversion material.

Figure 9:
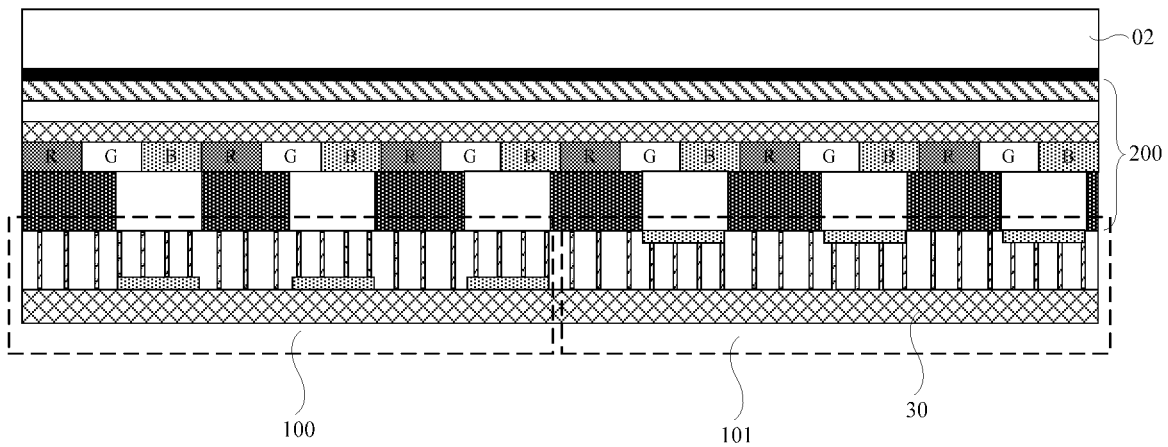
FIG. 9 shows a structural diagram of a display apparatus having two fingerprint identification devices according to yet some other embodiments of the disclosure.

According to some other embodiments, the first fingerprint identification device 100 and the second fingerprint identification device 101 are configured not to positionally correspond to each other, but rather can be arranged in a substantially same plane, as illustrated in FIG. 9. This configuration allows the OLED display apparatus to have a reduced thickness.

Herein, because the OLED display apparatus further includes a carrier substrate 30, which can cause a relatively increased distance from a finger F to the second fingerprint identification device 101 compared with the embodiments shown in FIG. 7 and FIG. 8. Thus in order to increase the accuracy for fingerprint identification using the second fingerprint identification device 101, in these embodiments of the OLED display apparatus, the plurality of light-transmitting portions in the light-guiding layer 13 in the second fingerprint identification device 101 can comprise optical fibers, each having a diameter of 0.001~0.2.

Figure 10:
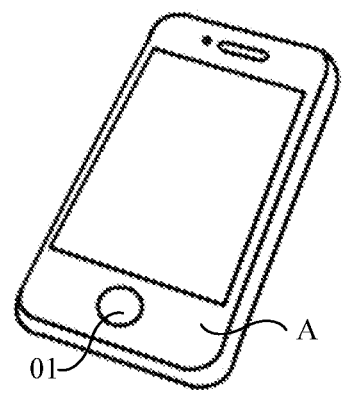
FIG. 10 shows one configuration approach for a fingerprint identification device according to some embodiments of the disclosure.

According to some embodiments, any of the first fingerprint identification device 100 and the second fingerprint identification device 101 can be configured to be over a light-emitting side of the OLED display apparatus and within a non-display area, such as at a region corresponding to a "HOME" button, as illustrated in FIG. 10. Because of the presence of the light-guiding layer 13, which allows reflected lights to enter the photosensitive elements 11 in a vertically and parallel manner without much dispersion, the finger F does not need to directly contact any of the first fingerprint identification device 100 and the second fingerprint identification device 101, and still is able to collect fingerprint images with high resolution.

Figure 11:
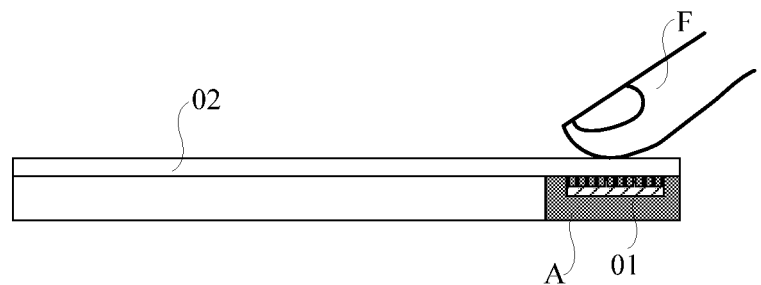
FIG. 11 shows one configuration approach for a fingerprint identification device according to some other embodiments of the disclosure.

As such, there is no need to arrange a touch hole in the cover glass 02 at a position corresponding to any of the first fingerprint identification device 100 and the second fingerprint identification device 101, as illustrated in FIG. 11. The manufacturing cost can thus be reduced. In addition, the "HOME" button can be skipped to further reduce the manufacturing cost.

It is noted that besides OLED, the display apparatus can be a liquid crystal display (LCD) apparatus.

It is also noted that according to some embodiments, the fingerprint identification device 01 has a relatively small area, and the fingerprint identification device 01 can be arranged at a light-emitting side and within a display area of the display apparatus.

In a second aspect, the disclosure further provides an improvement of the fingerprint identification device disclosed above which has a further increased fingerprint identification accuracy.

Figure 12:
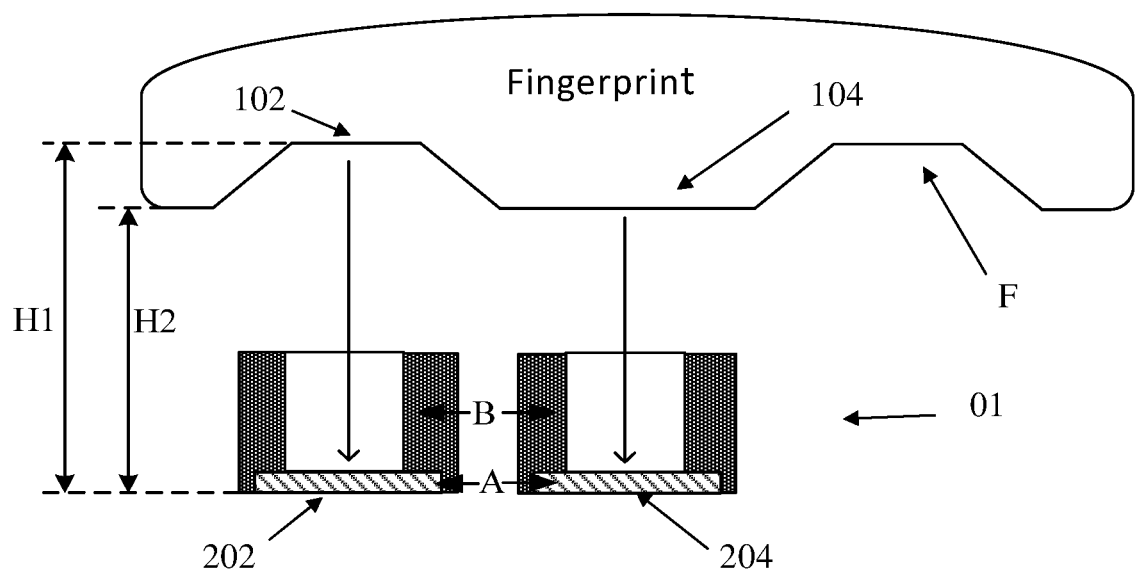
FIG. 12 illustrates a working principle of pattern identification according to some embodiments.

FIG. 12 illustrates a working principle of a pattern identification process of the fingerprint identification device according to some embodiments of the disclosure, where each of the plurality of light-transmitting portions is a through-hole surrounded by at least one light-shielding portion.

In the following, a fingerprint identification device is employed as an example to describe the pattern identification process, and it is frequently referred to a user swiping a finger over the fingerprint identification device for the fingerprint pattern to be positively identified by the fingerprint identification device. However, those of ordinary skill in the art will recognize that a pattern identification device according to various embodiments can be used to identify other biometric or non-biometric patterns. For example, a user can place a palm over a display surface of a display apparatus and be positively identified. In another example, a user can approach the display surface with the user's face, and be positively and securely identified through facial features such as depth patterns.

As shown in FIG. 12, when a finger F approaches or touches a fingerprint identification device 01, a valley 102 of the fingerprint has a first distance H1 from a photosensitive element 202 directly below the valley 102 of the fingerprint; a ridge 104 of the fingerprint has a second distance H2 from an photosensitive element 204 directly below the ridge 104 of the fingerprint; and the first distance H1 is greater than the second distance H2.

Similarly, a palmprint or a face also has its unique patterns of valleys and ridges, and can be employed for an identification process similar to the fingerprint identification process.

Therefore, a light transmission distance of the light reflected by the valley 102 through a light-guiding layer B to the photosensitive element 202 of the optical sensor A is relatively long, the light intensity is lower, and the electric current corresponding to the electrical signal generated by the photosensitive element 202 of the optical sensor A (which is typically transmitted through a data line, e.g. DL1) is smaller. A light transmission distance of the light reflected by the ridge 104 through the light-guiding layer B to the photosensitive element 204 of the optical sensor A is shorter, the light intensity is higher, and the electric current corresponding to the electrical signal generated by the photosensitive element 204 of the optical sensor A is larger.

Based on this principle, the valleys 102 or ridges 104 (i.e., fingerprint patterns) of the fingerprint can be identified by detecting electric current amplitudes corresponding to the electrical signals generated by photosensitive elements 202, 204, . . . , of the optical sensor A.

Figure 13A:
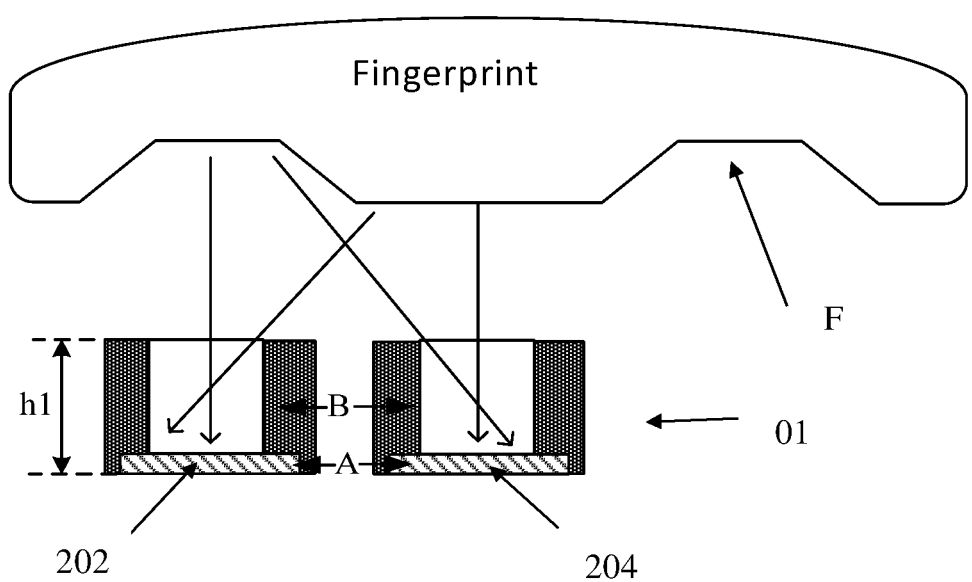
FIG. 13A is a schematic diagram of light reflected at a certain position of a finger being received by two optical sensors.

FIG. 13A is a schematic diagram of reflected light from a finger F at certain positions being received by two photosensitive elements 202, 204. As shown in FIG. 13A, light reflected from a certain position on the finger F may be received by two different photosensitive elements 202, 204 of the optical sensor A. As such, images of the valley 102 and ridge 104 can be mixed together, resulting in blurred images and degraded fingerprint identification results.

In order to avoid such problems, a thickness h1 of the light-guiding layer B can be generally increased such that light within a small range of incident angles is incident upon the corresponding photosensitive element of the optical sensor A.

Figure 13B:
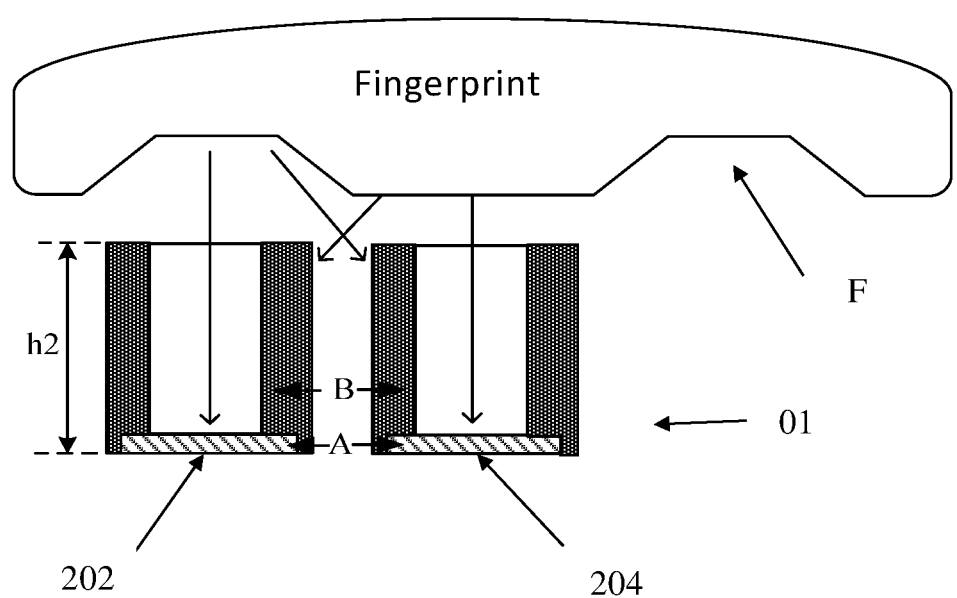
FIG. 13B is a schematic diagram of a case where the thickness of the light-guiding portion of FIG. 13A increases.

FIG. 13B illustrates a schematic diagram of a case where a thickness h2 of the light-guiding part A is increased. As shown in FIG. 13B, increasing the thickness of the light-guiding portion B (h2>h1) can effectively reduce a range of the incident angles. However, such a configuration may have an overall thickness of the fingerprint identification device increased, complicating efforts to reduce weight and thickness of a host apparatus of the fingerprint identification device, such as a display apparatus.

As such, by configuring a light-guiding layer having a relatively large thickness, the chance of light interference between two adjacent light-transmitting portions can be further reduced, which in turn can further increase the pattern identification accuracy for the device.

Figure 14:
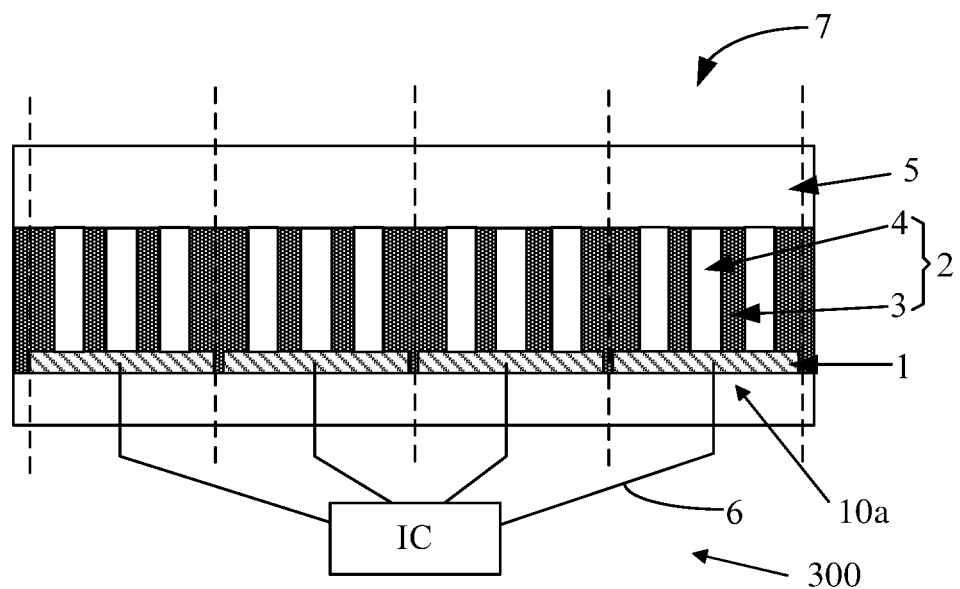
FIG. 14 is a schematic diagram of a fingerprint identification device according to Embodiment 1 of the present disclosure.

FIG. 14 illustrates a pattern identification device according to some embodiments of the present disclosure, where the pattern identification device is a fingerprint identification device. As shown, the fingerprint identification device 300 is divided into a plurality of identification regions 7 arranged in an array. The fingerprint identification device 300 includes a photosensitive layer 10a including a plurality of photosensitive elements 1, and a light-guiding layer 2. The photosensitive elements 1 are configured to perform photoelectric conversion of incident light.

In the embodiments described below as examples, the photosensitive elements 1 are in a one-to-one correspondence with the identification regions 7, that is, each identification region has one photosensitive element associated thereof. However, it is noted that in some other embodiments each identification region can have multiple photosensitive elements associated thereof.

The photosensitive elements 1 can be arranged in an array and comprise, for example, a photodetector such as an optoelectronic semiconductor element, a photodiode, a complementary metal-oxide-semiconductor (CMOS) detector, or any other types of sensors that can convert light into electrical signals.

The light-guiding layer 2 includes a plurality of light-shielding portions 3, and a plurality of light-transmitting portions 4. In the example shown in FIG. 14, each photosensitive element 1 corresponds to an area having multiple light-transmitting portions 4 configured to transmit light onto multiple areas of the photosensitive element 1.

The photosensitive element 1 can therefore have a photoelectric conversion pattern formed by the multiple areas. The photoelectric conversion pattern can generate electrical signals corresponding to different light intensities as received.

The material of the photosensitive layer can be or include an organic photoelectric conversion material, or an inorganic photoelectric conversion material, such as a semiconductor material.

Light from an opposite side, e.g., on the side of the photosensitive layer 10a facing away from the light-guiding layer 2, may be incident upon the photosensitive layer 10a from the backside, generating interfering electrical signals. In some embodiments, the fingerprint identification device 300 can further include a light-shielding pattern (not shown). The light-shielding pattern can be disposed over the side of the photoelectric conversion pattern facing away from the light-guiding layer 2, and completely cover the corresponding photoelectric conversion pattern.

Figure 15:
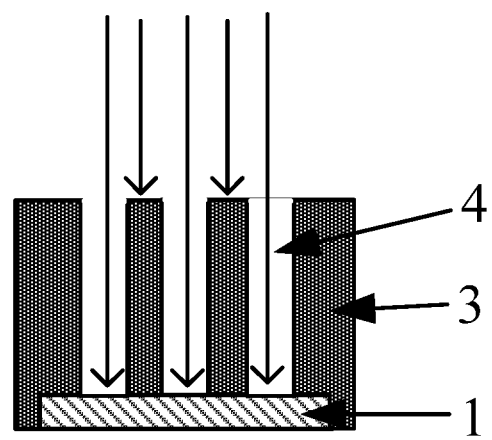
FIG. 15 is a schematic diagram of different light beams incident on the light-guiding layer.

FIG. 15 is a schematic diagram of different light beams incident upon the light-guiding layer. As shown in FIG. 14 and FIG. 15, the light-guiding layer 2 includes a plurality of light-shielding portions 3, and a plurality of light-transmitting portions 4. The material of the light-shielding portions 3 can be a light-shielding material, and the light-transmitting portions 4 may be made of a transparent material, or have a through-hole structure.

It is noted that in some embodiments of the pattern identification device, the light-transmitting portions 4 can have a waveguide or optical-fiber structure configured to guide light accurately. In some embodiments, the light-transmitting portions 4 can comprise micro-lens structures configured to focus light.

In some embodiments of the present disclosure, the light-guiding layer 2 can filter the light incident on the photosensitive element 1, thereby defining the incident angles of the light reaching the photosensitive element 1. In some embodiments, the light-transmitting portion 4 has a through-hole structure, with a preset angle (between the incident light and the bottom plane where the photosensitive element is located) to limit unwanted light of smaller incident angles incident upon the photosensitive element 1. For example, the preset angle can be about 88.8° to 90° in some embodiments. The light transmitted to the photosensitive element 1 is therefore perpendicular or approximately perpendicular to the photosensitive element 1, which effectively reduces unwanted, scattered light toward the photosensitive element 1.

It should be noted that the cross-section shape of the light-transmitting portion 4 can be circular, rectangular, triangular, regular, or irregular. In some embodiments described below as examples, the cross-section of the light-transmitting portion 4 has a shape of a circle. Yet according to some other embodiments (not shown in the drawings), the light-shielding portions 3 comprise a plurality of light-shielding bars that are arranged to form a lattice-like structure to thereby define a light-transmitting portion in each lattice hole. As such, in these embodiments, the cross-section of the light-transmitting portion 4 has a shape of a rectangle.

In some embodiments as illustrated in FIG. 14, an external chip IC is configured to obtain an electric signal (e.g. output current) of each photosensitive element 1. One of a plurality of signal wires 6 can be employed for conducting the electric signal outputted from each of the plurality of photosensitive elements 1 to the external chip IC.

According to some embodiments of the present disclosure, with a constant minimum total cross-sectional area of the light-transmitting portions 4 for each photosensitive element 1, each photosensitive element 1 can be configured to correspond to a plurality of light-transmitting portions 4 (e.g., through-holes). As such, the cross-sectional area of each light-transmitting portion 4 can be accordingly reduced.

Meanwhile, with a constant minimum value of the preset angle range defined by the light-guiding layer 2, the thickness (e.g., the depth of the through-holes) of the light-guiding layer 2 can be reduced accordingly. Therefore, the embodiments of the present disclosure can effectively reduce the thickness of the light-guiding layer 2, thereby achieving a fingerprint identification device that is light and thin.

In addition, in the case that the minimum value of the preset angle range defined by the light-guiding layer 2 is a constant, for any one photosensitive element 1, a plurality of light-transmitting portions 4 (e.g., thought-holes) are provided in the corresponding identification region 7 to improve the amount of light transmission, and the accuracy of fingerprint identification.

More specifically, according to some embodiments of the present disclosure, the plurality of through-holes are arranged in an array. For example, the array can be an M×N array, or an N×M array, where M, N are integers greater than or equal to 1. In some embodiments, M, N are larger than 1.

The optical-detection-based fingerprint identification device according to some embodiments of the present disclosure therefore can include one or more photosensitive elements, among which one photosensitive element corresponding to a plurality of light-transmitting portions. The thickness of the light-guiding layer 2 can thus be reduced, helping to make fingerprint identification device light and thin. In addition, increasing the number of light-transmitting portions 4 can improve the amount of transmitted light.

As illustrated in FIG. 14, in some embodiments of the present disclosure, the fingerprint identification device can further include a transparent cover 5, which is disposed over a side of the light-guiding layer 2 distal from the photosensitive layer. In some embodiments, the fingerprint identification device 300 is configured such that all light directed to the light-guiding layer 2 through any position on a surface of the transparent cover 5 opposing to the light-guiding layer 2 (i.e. the upper surface of the transparent cover 5 shown in FIG. 14) are received by at most one photosensitive element, to avoid cross-interference between photosensitive elements. In some embodiments, the transparent cover 5 is also configured to protect the light-guiding layer 2 to improve the service life of the fingerprint identification device 300.

Figure 16:
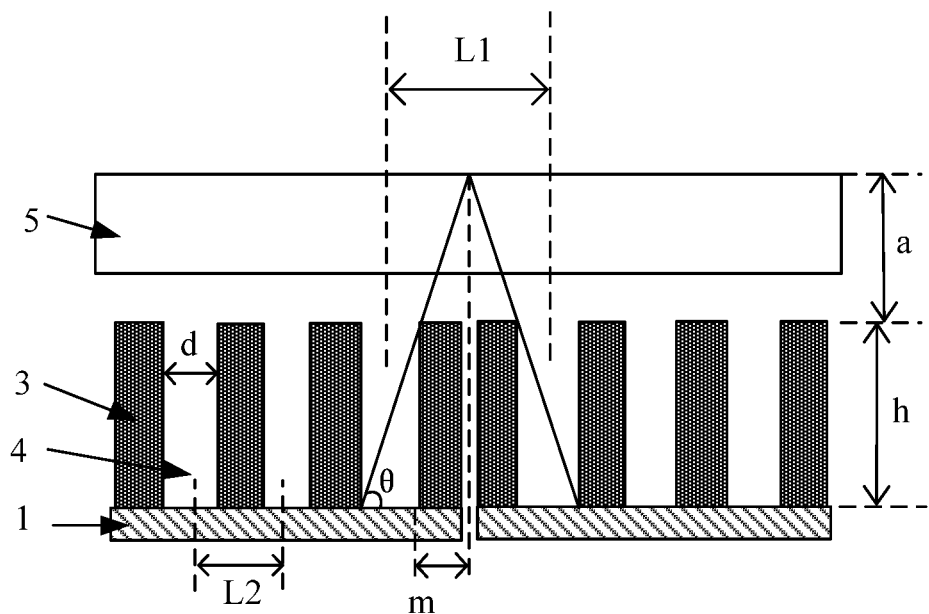
FIG. 16 is a sectional view of two adjacent photosensitive elements according to some embodiments of the present disclosure.

FIG. 16 is a sectional view of two adjacent photosensitive elements according to some embodiments of the present disclosure. As shown in FIG. 16, an extending direction of the light-transmitting portion 4 is perpendicular to the transparent cover 5. A cross-sectional area of the light-transmitting portion 4 in a plane parallel to the transparent cover 5 has a circular shape. A diameter of the circular cross-section of the light-transmitting portion 4 is denoted by d. A thickness of the light-guiding layer 2 (e.g., the depth of the light-transmitting portion 4) is denoted by h.

According to some embodiments, a minimum distance between central points of two adjacent light-transmitting portions corresponding to different photosensitive elements in the light-guiding layer 2 is denoted by L1.

A minimum distance between an edge of each of these two light-transmitting portions 4 and a perimeter of an identification region is denoted by m. In the example shown in FIG. 16, the perimeter is defined by the two adjacent photosensitive elements 1. A distance between an upper surface of the transparent cover 5 distal from the light-guiding layer 2 and an upper surface of the light-guiding layer 2 facing the transparent cover 5 is denoted by a. A minimum angle in the preset angle range is denoted by θ.

From the geometrical configuration illustrated in FIG. 16, it can be seen that, $$\tan\theta = \frac{h}{d} = \frac{h+a}{d+m} \quad (1)$$

In order to ensure that any position on the upper surface of the transparent cover 5 distal from the light-guiding layer 2 can only be imaged in one photosensitive element 1, the following relationship is met according to some embodiments of the present disclosure:

$$d+2m \leq L1 \quad (2)$$

Considering equations (1) and (2) together, it can be introduced that the thickness h of the light-guiding layer 2 satisfies:

$$h \geq \frac{2ad}{L1-d} \quad (3)$$

Therefore, in the embodiments as shown, the distance a between the upper surface of the transparent cover 5 distal from the light-guiding layer 2 and the upper surface of the light-guiding layer 2 facing the transparent cover 5, the diameter d of the cylindrical light-transmitting portion 4, and the minimum distance L1 between the central points of the two light-transmitting portions 4 corresponding to different photosensitive elements 1 in the light-guiding layer 2 can be all predetermined to avoid the problem of blurred imaging of the fingerprint. As a result, the minimum thickness h of the light-guiding layer 2 is $$\frac{2ad}{L1-d}$$

as shown in equation (3).

In some embodiments, in order to provide more light-transmitting portions in the identification region corresponding to one photosensitive element 1, the maximum distance between the center points of two adjacent light-transmitting portions 4 in the light-guiding layer 2 corresponding to one photosensitive element in a column or in a row and is denoted by L2, and L2<L1.

In this way, light from one specific position on the pattern (e.g., a fingerprint) to be identified, although capable of going into a plurality of light-transmitting portions 4 corresponding to a same photosensitive element 1 thereby increasing the detection sensitivity, is not incident upon different photosensitive elements 1 thereby reducing a probability of blurred image of the pattern.

An optimization process of designing the fingerprint identification device 300 can be realized by varying various geometric sizes in the structure, such as varying the distance a to a', changing a thickness of the light-guiding layer 2 from h to h'=xh, where x is a coefficient between 0 and 1 reflecting a desired design of making the device thinner, and changing an aperture of the light-transmission portion 4 from d to d'=yd, where y is a coefficient between 0 and 1.

Because the distance a is usually limited by the thickness of the transparent cover 5, a=a'. To achieve that light from a specific position on a pattern to be identified does not go into different photosensitive elements, e.g., not into different groups of light-transmitting portions, from the above equation (3), it can be derived that:

$$a' = a < \frac{h'(L'-d')}{2d'} = \frac{x}{y}\frac{h(L'-yd)}{2d} \quad (4)$$

$$\frac{x}{y}\frac{h(L'-yd)}{2d} = \frac{h(L-d)}{2d}$$

$$L' = (L+(x-1)d)\frac{y}{x}$$

For a group of n×n light-transmitting portions that correspond to one photosensitive element, looking at a side cross section such as that in FIG. 16, one gets:

$$L'-d'+(n-1)(L2-d)+nd'=w \quad (5)$$

Wherein w is a width of an identification region, referring to an example shown in FIG. 17A and described below. Therefore, $$L2-d=(x-y)w/(n-1)/x+(y-nxy)d/(n-1)/x \quad (6)$$

To satisfy that the amount of light transmission is larger in the case of each photosensitive element corresponding to multiple light-transmission portions compared with the case of each photosensitive element corresponding to only one light-transmission portion, $$n^{2*}\pi*\left(\frac{yd}{2}\right)^2 > \pi*\left(\frac{d}{2}\right)^2 \quad (7)$$

That is, $$n^2y^2>1 \quad (8)$$

In the following, a simpler example of one photosensitive element 1 corresponding to one light-transmitting portion 4 is employed to describe some beneficial effects of various embodiments of the present disclosure, where one photosensitive element 1 can correspond to a plurality of light-transmitting portions 4.

Figure 17A:
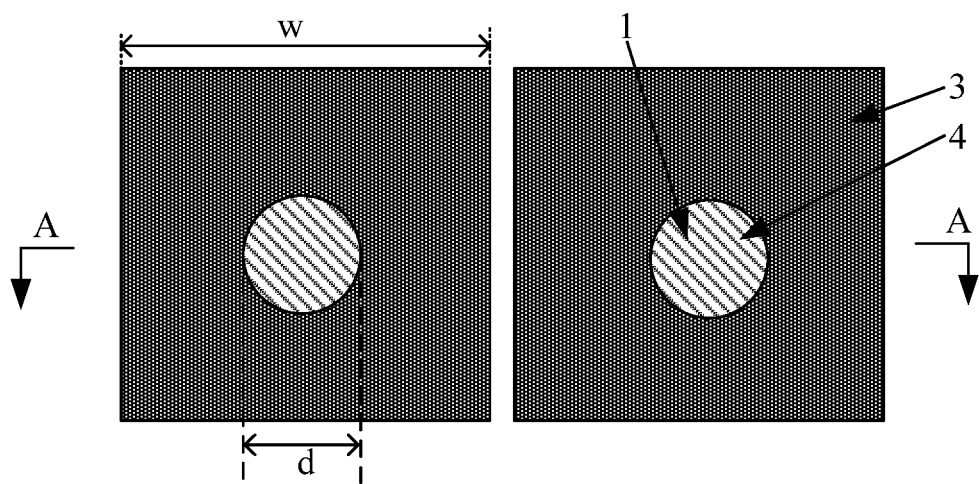
FIG. 17A is a top view of a portion of the light-guiding layer corresponding to two identification regions in a comparative example.
Figure 17B:
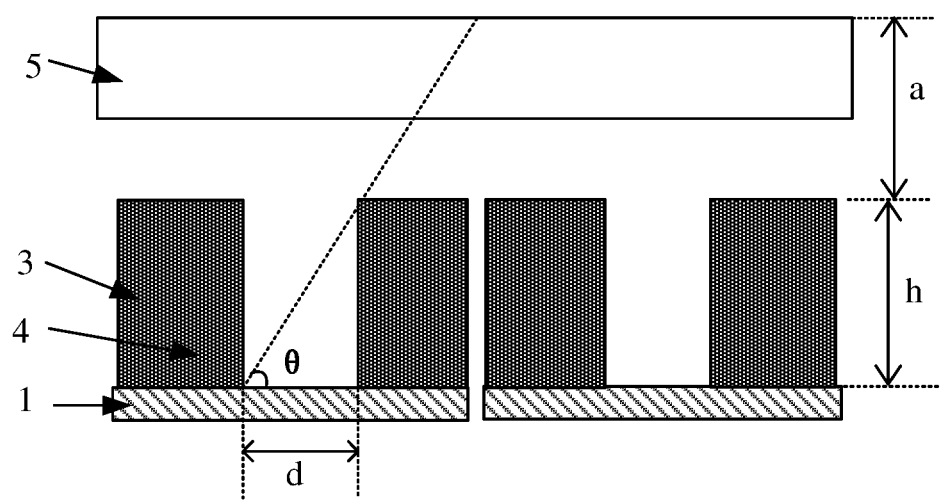
FIG. 17B is a sectional view taken along line A-A in FIG. 17A.

FIG. 17A illustrates a top view of a portion of the light-guiding layer 2 having two identification regions in this simplified example. FIG. 17B illustrates a sectional view taken along line A-A in FIG. 17A. As shown in FIG. 17A and FIG. 17B, only one corresponding light-transmitting portion 4 exists in each identification region 7, and the light-transmitting portion 4 is located at a center of its corresponding identification region where the photosensitive element 1 is located.

The identification region 7 is a square in shape, with a side length w of 50.8 μm in this example. This corresponds to an identification resolution of 500 ppi. The minimum angle θ of the preset angle range is 88.8°. The diameter d of the cylindrical light-transmitting portion 4 is about 10.3 μm in this example. The thickness h of the light-guiding layer 2 is about 498.5 μm in this example. Therefore, a light-transmitting area $$\pi\left(\frac{d}{2}\right)^2$$

of the identification region 7 is about 83.32 μm².

Figure 18A:
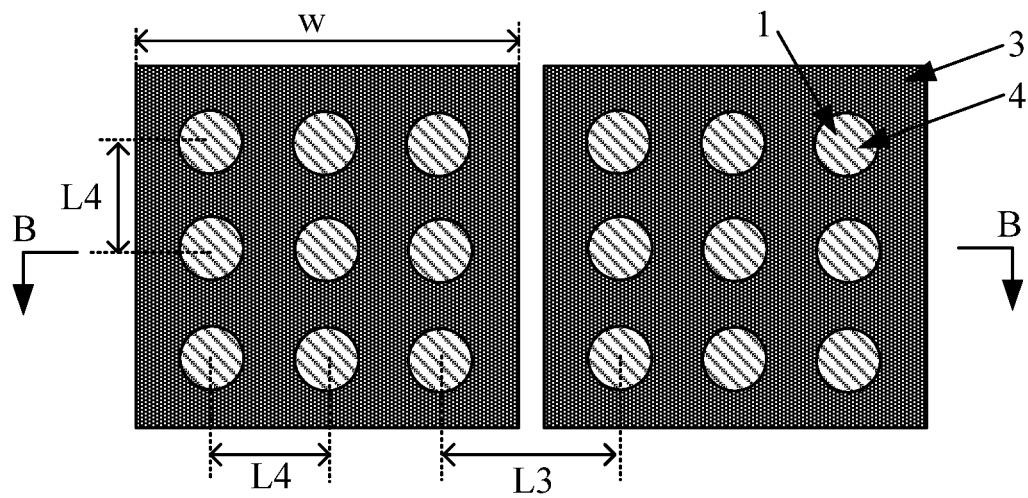
FIG. 18A is a top view of a portion of the light-guiding layer corresponding to two identification regions according to some embodiments of the present disclosure.
Figure 18B:
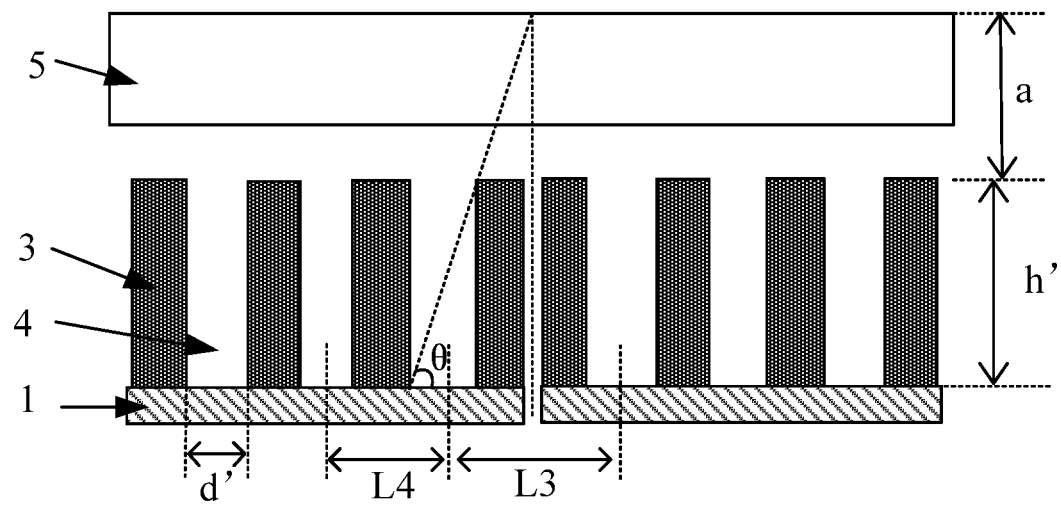
FIG. 18B is a sectional view taken along line B-B in FIG. 18A.

FIG. 18A illustrates a top view of a portion of the light-guiding layer 2 having two identification regions each having a plurality of light-transmitting portions 4. FIG. 18B illustrates a sectional view taken along line B-B in FIG. 18A.

In some embodiments of the present disclosure, as shown in FIG. 18A and FIG. 18B, each identification region corresponds to nine light-transmitting portions 4. The nine light-transmitting portions are arranged in a 3×3 array. The distances L4 between the center points of any two adjacent light-transmitting portions 4 in a row or in a column and corresponding one photosensitive element 1, are equal.

The distances L3 between the center points of any two light-transmitting portions 4 in the light-guiding layer 2, which correspond to different photosensitive elements 1 and are adjacent to each other either in a row or in a column and, are also equal in this example. However, it is noted that in some other embodiments these distances can be different, resulting in more complex distribution patterns of the light-transmitting portions.

In some embodiments, as illustrated in FIG. 18A and FIG. 18B, the identification region 7 is a square with a side with w of about 50.8 μm. The diameter d' of the circular cross-section of the light-transmitting portion is about 3.6 μm. The distance L3 between the center points of two light-transmitting portions in the light-guiding layer, which correspond to different photosensitive elements and are adjacent to each other either in a column or in a row, is in a range of 17.8 μm to 35.1 μm.

The distance L4 between the center points of two light-transmitting portions 4 in the light-guiding layer 2, which correspond to one photosensitive element 1 and are adjacent to each other either in a column or in a row, is less than L3. The distance a between the upper surface of the transparent cover 5 distal from the light-guiding layer 2 and the upper surface of the light-guiding layer 2 facing the transparent cover 5 is about 980 μm. The thickness h' of the light-guiding layer 2 is in a range of about 174.5 μm-498.5 μm.

Table 1 shows various parameters of the light-guiding layer 2, in the case that nine light-transmitting portions are included in one identification region, and the diameter of the circular cross-section of the light-transmitting portion is about 3.6 μm.

TABLE 1

| Serial Number | Diameter d' (μm) | Distance L3 (μm) | Distance L4 (μm) | Distance a (μm) | Thickness h' (μm) | h'/h |
|---|---|---|---|---|---|---|
| 1 | 3.6 | 35.1 | 7.85 | 980 | 224.3 | 0.45 |
| 2 | 3.6 | 29.4 | 10.7 | 980 | 274.2 | 0.55 |
| 3 | 3.6 | 25.4 | 12.7 | 980 | 324.0 | 0.65 |
| 4 | 3.6 | 22.5 | 14.15 | 980 | 373.9 | 0.75 |
| 5 | 3.6 | 20.3 | 15.25 | 980 | 423.7 | 0.85 |
| 6 | 3.6 | 18.5 | 16.15 | 980 | 473.5 | 0.95 |
| 7 | 3.6 | 17.8 | 16.5 | 980 | 498.5 | 1.00 |

It can be seen from Table 1 that in the case where one identification region 7 corresponds to nine light-transmitting portions 4 and the diameter d' of the circular cross-section of the light-transmitting portion 4 is 3.6 about μm, a ratio between the thickness h' of the light-guiding layer 2 the thickness h of the light-guiding layer 2 in the comparative example illustrated in FIG. 18A and FIG. 18B is in a range of 0.45 to 1.00. That is, in the case that the minimum light transmission angle θ of the light-guiding layer 2 is constant, and one photosensitive element 1 corresponds to a plurality of light-transmitting portions 4, the thickness of the light-guiding layer 2 can be effectively reduced, which can make the fingerprint identification device lighter and thinner.

In addition, when one identification region 7 corresponds to nine light-transmitting portions 4 and the circular cross-section diameter d' of the light-transmitting portion 4 is 3.6 μm, the light-transmitting area $$\pi\left(\frac{d'}{2}\right)^2$$

of the identification region 7 is 91.56 μm², which is larger than the light-transmitting area 83.32 μm² of the identification region 7 in the comparative example. That is, the approach of adopting a plurality of light-transmitting portions 4 can effectively improve the light-transmitting area of the identification region 7, enhance the amount of light transmitted through the light-guiding layer 2, which is conducive to improve the accuracy of fingerprint identification.

In some embodiments, the identification region 7 is a square and the side length w is 50.8 μm. The diameter d' of the circular cross-section of the light-transmitting portion 4 is 6.7 μm. The distance L3 between the center points of two light-transmitting portions in the light-guiding layer 2, which correspond to different photosensitive elements and are adjacent to each other either in a column or in a row, is 33.0 μm to 35.9 μm. The distance a between the surface of the transparent cover 5 opposite to the light-guiding layer 2 and the surface of the light-guiding layer 2 facing the transparent cover is 980 μm. The thickness h' of the light-guiding layer 2 is 423.7 μm-498.5 μm.

Table 2 shows various parameters of the light-guiding layer, when there are nine light-transmitting portions in one identification region and the diameter of the circular cross-section of the light-transmitting portion is 6.7 μm.

TABLE 2

| Serial Number | Diameter d' (μm) | Distance L3 (μm) | Distance L4 (μm) | Distance a (μm) | Thickness h' (μm) | h'/h |
|---|---|---|---|---|---|---|
| 1 | 6.7 | 35.9 | 7.45 | 980 | 448.6 | 0.90 |
| 2 | 6.7 | 34.4 | 8.2 | 980 | 473.5 | 0.95 |
| 3 | 6.7 | 33.0 | 8.9 | 980 | 498.5 | 1.0 |

It can be seen from Table 2 that when one identification region 7 corresponds to nine light-transmitting portions 4 and the diameter d' of the circular cross-section of the light-transmitting portion 4 is 6.7 μm, the thickness h' of the light-guiding layer 2 is 0.90 to 1.00 times the thickness h of the light-guiding layer 2 in the comparative example. That is, when the minimum light transmission angle θ of the light-guiding layer 2 is constant, and one photosensitive element 1 corresponds to a plurality of light-transmitting portions 4, the thickness of the light-guiding layer 2 can be effectively reduced, which can make the fingerprint identification device light and thin.

In addition, in the case that one identification region 7 corresponds to nine light-transmitting portions 4 and the diameter d' of the circular cross-section of the light transmitting portion 4 is about 6.7 μm, the light transmitting area $$\pi\left(\frac{d'}{2}\right)^2$$

of the identification region 7 is 317.3 μm², which is larger than the light-transmitting area 91.56 μm² of the identification region 7 corresponding to nine light-transmitting portions 4 and the diameter d' of the circular cross-section of a light-transmitting portion 4 is 3.6 μm. That is, in the case that the number of the light-transmitting portions 4 in the identification area 7 is constant, the larger the diameter of the light-transmitting portion 4, the larger the amount of light transmitted through the light-guiding layer 2.

It is noted that in the above, the specific measurements for various parts, such as the diameter of the circular cross-section of the light-transmitting portion, the thickness of the light-guiding layer, are for illustrating purpose only, and do not impose limitations to the disclosure, and each of these measurements can have a range.

Figure 19A:
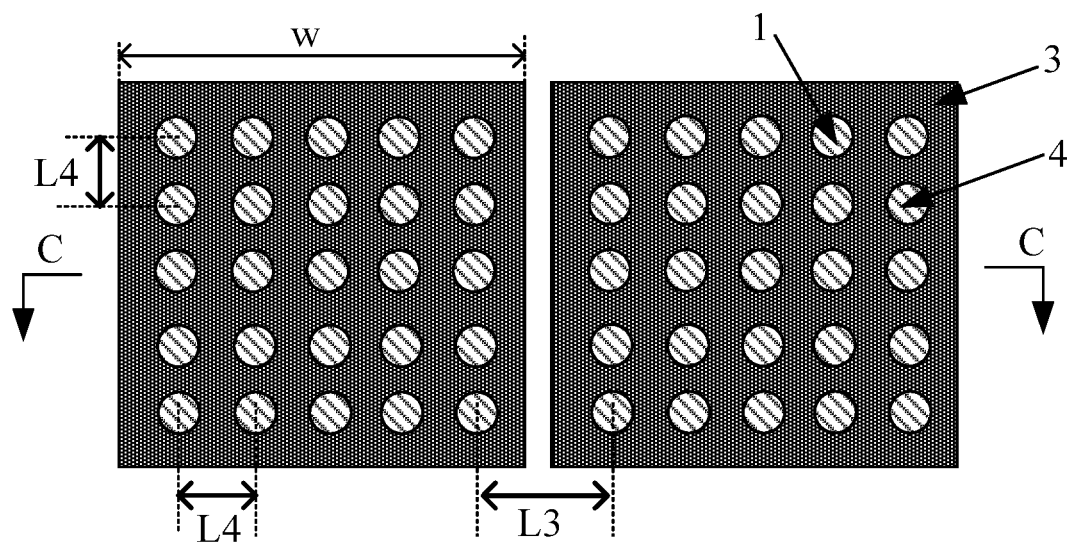
FIG. 19A is another top view of a portion of the light-guiding layer corresponding to two identification regions according to some embodiments of the present disclosure.

FIG. 19A illustrates a top view of a portion of a light-guiding layer 2 with two identification regions. It is noted that according to some embodiments of the present disclosure, more than two identification regions can be included in the light-guiding layer 2. However, the example of two identification regions is described herein to illustrate technical approaches and advantages of various embodiments according to the present disclosure.

Figure 19B:
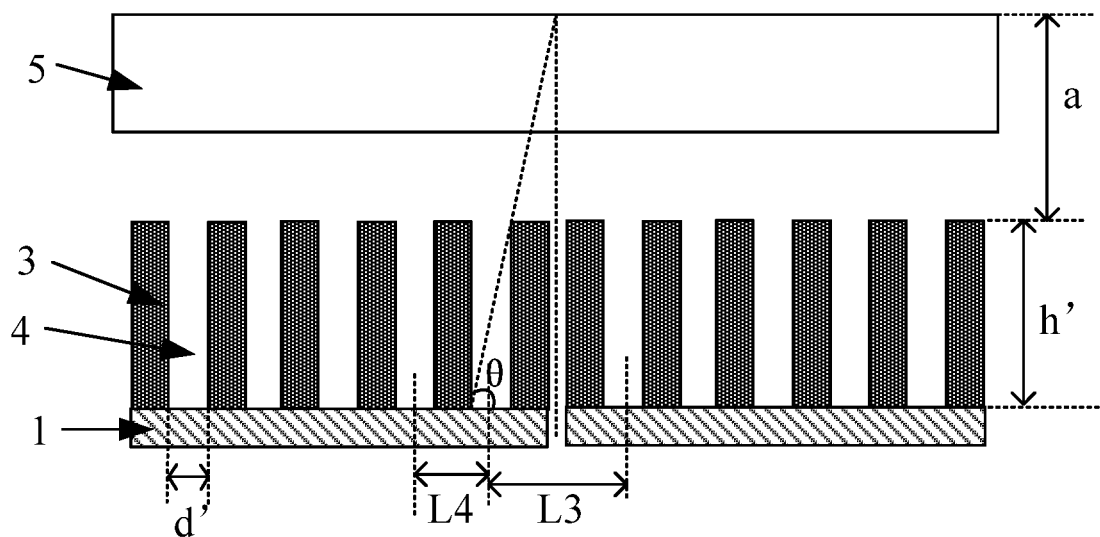
FIG. 19B is a sectional view taken along line C-C in FIG. 19A.

FIG. 19B illustrates a sectional view taken along line C-C in FIG. 19A. In some embodiments of the present disclosure, as shown in FIG. 19A and FIG. 19B, each identification region corresponds to twenty-five light-transmitting portions 4. The twenty-five light-transmitting portions are arranged in a 5×5 array.

For these twenty-five light-transmitting portions 4, the distances L4 between the center points of any two light-transmitting portions 4, which correspond to one photosensitive element 1 and are adjacent to each other either in a row or in a column, are equal. It is noted that in some other embodiments, the distances L4 are not necessarily equal, and more complex patterns of distributions of the light-transmitting portions 4 can be employed.

The distances L3 between the center points of any two light-transmitting portions 4 in the light-guiding layer 2, which correspond to different photosensitive elements 1 and are adjacent to each other either in a row or in a column, are also equal in the example illustrated in FIG. 19A and FIG. 19B. However, it is noted that in some other embodiments, the distances L3 are not necessarily equal, and more complex patterns of distributions of the light-transmitting portions 4 across multiple identification regions can be employed.

In some embodiments, as illustrated in FIG. 19A, the identification region 7 has a shape of a square with side width w of about 50.8 μm. The diameter d' of the circular cross-section of the light-transmitting portion 4 is about 5.15 μm in this example.

The distance L3 between the center points of two light-transmitting portions in the light-guiding layer 2, which correspond to different photosensitive elements and are adjacent to each other either in a column or in a row, is in a range of about 25.4 μm to 29.0 μm.

The distance L4 between the center points of two light-transmitting portions 4 in the light-guiding layer 2, which correspond to one photosensitive element 1 and are adjacent to each other either in a column or in a row, is less than L3, i.e., L4<L3. The distance a between the upper surface of the transparent cover 5 distal from the light-guiding layer 2 and the upper surface of the light-guiding layer 2 facing the transparent cover is about 980 μm. The thickness h' of the light-guiding layer 2 is in a range of about 423.7 μm to 498.5 μm.

Table 3 shows various parameters of the light-guiding layer 2, with twenty-five light-transmitting portions in each identification region, and a diameter of the circular cross-section of the light-transmitting portion of about 5.15 μm.

TABLE 3

| Serial Number | Diameter d' (μm) | Distance L3 (μm) | Distance L4 (μm) | Distance a (μm) | Thickness h' (μm) | h'/h |
|---|---|---|---|---|---|---|
| 1 | 5.15 | 29.0 | 5.45 | 980 | 423.7 | 0.85 |
| 2 | 5.15 | 27.7 | 5.78 | 980 | 448.6 | 0.90 |
| 3 | 5.15 | 26.45 | 6.09 | 980 | 473.5 | 0.95 |
| 4 | 5.15 | 25.4 | 6.35 | 980 | 498.5 | 1.0 |

As can be seen from Table 3, in the case that one identification region 7 corresponds to twenty-five light-transmitting portions 4 and the diameter d' of the circular cross-section of the light-transmitting portion 4 is about 5.15 μm, a ratio between the thickness h' of the light-guiding layer 2 and the thickness h of the light-guiding layer 2 in the comparative example illustrated in FIG. 19A and FIG. 19B is in a range of about 0.85 to 1.00. That is, in the case that the minimum light transmission angle θ of the light-guiding layer 2 is constant, and one identification region 7 corresponds to a plurality of light-transmitting portions 4, the thickness of the light-guiding layer 2 can be effectively reduced, resulting in a lighter and thinner fingerprint identification device.

Moreover, in the case that one identification region 7 corresponds to twenty-five light-transmitting portions 4 and the diameter d' of the circular cross-section of the light-transmitting portion 4 is about 6.7 µm, the light-transmitting area $$\pi \left(\frac{d'}{2}\right)^2$$

of the identification region 7 is 520.8 µm², which is larger than the light-transmitting area of the identification region 7 corresponding to nine light-transmitting portions 4 in the comparative example illustrated in FIG. 19A and FIG. 19B. Therefore, in the case that the thickness of the light-guiding layer 2 is constant, the larger the number of the light-transmitting portions 4 in the identification region 7, the larger the amount of light transmitted through the light-guiding layer 2.

Therefore, according to various embodiments of the present disclosure, a fingerprint identification device can have one photosensitive element corresponding to a plurality of light-transmitting portions. The cross-section area of each light-transmitting portion can be reduced, and the thickness of the light-guiding layer can also be reduced accordingly. As a result, a lighter-weight and thinner fingerprint identification device can be realized. In addition, increasing the number and/or density of the light-transmitting portions can improve the amount of light transmission, which improves the identification accuracy.

In a second aspect, the present disclosure further provides a display apparatus, which includes a pattern identification device according to any one of the embodiments as described above.

According to some embodiments of the display apparatus, the pattern identification device can be arranged as a piece positionally separated from a display panel of the display apparatus.

According to some other embodiments of the display apparatus, the pattern identification device can be integrated with a display panel of the display apparatus. In these embodiments, the display panel can be disposed over the light-guiding layer and below the first surface, with a light-emitting side and a non-light-emitting side thereof facing the first surface and the light-guiding layer, respectively. The display panel is further configured such that a portion thereof positionally corresponding to each of the plurality of photosensitive elements is light-transmissive such that lights from the display panel can, upon reflection by the pattern over the first surface, transmit through the portion of the display panel to reach the each of the plurality of photosensitive elements.

Herein the portion of the display panel can comprise at least one transparent pixel electrode, or can be provided with at least one second through-hole allowing the portion to be light-transmissive.

The corresponding relationship between the pixels in the display panel and the photosensitive elements can have different configurations. According to some embodiments, the portion of the display panel comprises one transparent pixel electrode, and as such, there is a substantially one-to-one relationship between the pixels in the display panel and the photosensitive elements in the pattern identification device. Such a configuration allows a more accurate pattern identification for the display apparatus.

According to some other embodiments, the portion of the display panel comprises more than one transparent pixel electrode. Thus, one photosensitive element substantially corresponds to more than two pixels in the display panel. Such a configuration can allow the manufacturing cost to be relatively lower.

Figure 20:
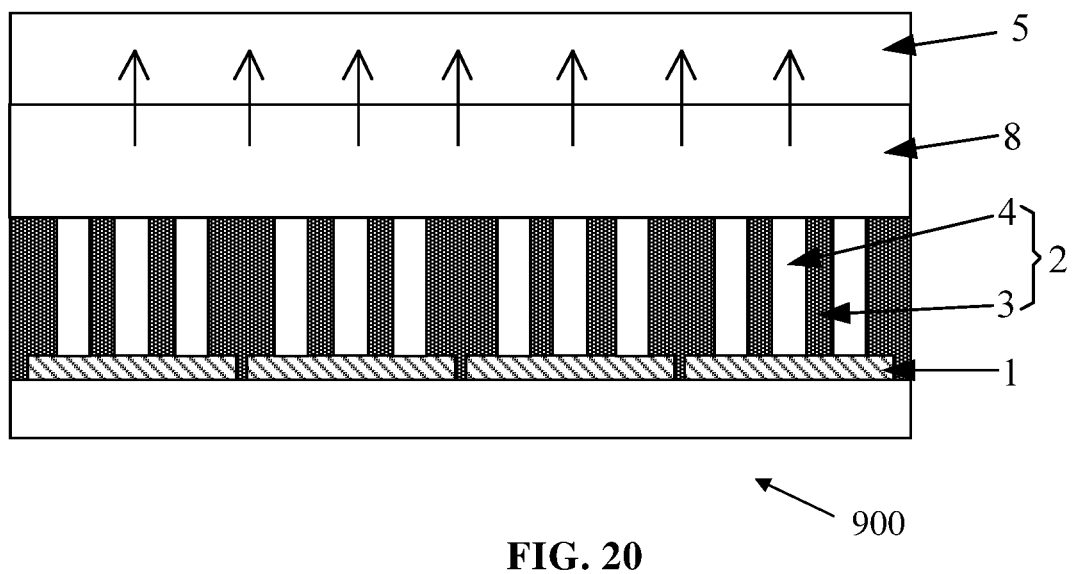
FIG. 20 is a schematic diagram of a display apparatus according to Embodiment 2 of the present disclosure.

As shown in FIG. 20, the display apparatus 900 comprises a fingerprint identification device as described above, including for example a plurality of photosensitive elements 1, a light-guiding layer 2 including light-shielding portions 3, light-transmitting portions 4, and a transparent cover 5.

In some embodiments, the display apparatus further includes a display panel 8. The fingerprint identification device can have most or all of its components located on a non-light-emitting side of the display panel 8. The photosensitive elements 1 in the fingerprint identification device are correspondingly arranged with light-permeable areas of the display panel 8, to thereby receive reflected light from a fingerprint.

The display panel 8 according to some embodiments can be specifically an organic light-emitting diode (OLED) display panel. During a fingerprint identification process, light emitted by the OLED display panel 8 can be irradiated to the finger and reflected. A portion of the reflected light passes through the light-permeable areas of the OLED display panel 8 and the light-guiding layer 2, before reaching the photosensitive elements 1. Based on amplitudes of electrical current output by the photosensitive elements 1, it can be determined whether the portion of the fingerprint corresponding to a specific photosensitive element 1 is a valley or a ridge.

In some embodiments, in order to enhance light reflected by the finger toward the photosensitive element, the OLED in the OLED display panel is a top emission type.

Moreover, to reduce a thickness of the display apparatus 900, a common transparent cover 5 can be used for both the OLED display panel 8 and the fingerprint identification device. The display apparatus 900 can thus be an integral apparatus integrated with the fingerprint identification device and the common transparent cover. The fingerprint identification device does not affect a display area of the display apparatus 900, i.e., the display apparatus 900 displays content in the area where the fingerprint identification device is located as if the fingerprint identification device does not exist.

A user seeking to be positively identified, for example to turn on or operate the display apparatus 900 can simply swipe a finger in the predetermined area where the fingerprint identification device is located, and the display apparatus 900 turns on and starts to display content on its display area including the predetermined area where the fingerprint identification device is located.

In some embodiments, the photosensitive elements 1 can be disposed throughout the display area of the display apparatus 900. In this case, fingerprint identification can be achieved anywhere on the display area, such as across a whole screen of the display apparatus. For example, a user can swipe or touch a finger, a palm, a patterned key card, or approach the apparatus with a face anywhere on the screen, and the apparatus can be turned on or operated as desired, after a positive identification is established. Facial features such as depth profiles also include "valleys" and "ridges" as those described above with respect to a fingerprint, and thus can also be identified with a similar principle. However, because characteristic widths of these "valleys" and "ridges" are larger than those of a fingerprint or a palmprint, the characteristic sizes of the identification regions such as the pitch and density of the identification regions may also need to be changed.

In some other embodiments, the pattern identification device is configured to secure an apparatus other than a display apparatus. For example, the pattern identification device can be part of a lock, a safe, a door, a vehicle, etc.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

What is claimed is:

1. A pattern identification device for identifying a pattern over a first surface thereof, comprising:
    a photosensitive layer comprising a plurality of photosensitive elements, each configured to convert a light shedding thereon into an electrical signal; and
    a light-guiding layer disposed between the photosensitive layer and the first surface;
    wherein:
        the light-guiding layer comprises a plurality of light-guiding units, each positionally corresponding to one of the plurality of photosensitive elements, wherein:
        each of the plurality of light-guiding units comprises a plurality of light-transmitting portions, each configured to guide a light beam reflected from a feature of the pattern positionally corresponding thereto to transmit therethrough and reach one of the plurality of photosensitive elements corresponding to the each of the plurality of light-guiding units;
        each of the plurality of light-transmitting portions comprises a through-hole surrounded by at least one light-shielding portion;
        an angle of the light beam transmitting through the each of the plurality of light-transmitting portions and reaching the one of the plurality of photosensitive elements corresponding to the each of the plurality of light-guiding units relative to a plane substantially perpendicular to the through-hole is within a range of 88.8°-90°;
        the pattern identification device further comprises a transparent cover, disposed between the light-guiding layer and the first surface;
        a cross-sectional shape of the through-hole in the each of the plurality of light-transmitting portions in a plane parallel to the transparent cover is circular;
    a diameter of the circular cross-section of the through-hole in the each of the plurality of light-transmitting portions is denoted by d;
    a minimum distance between central points of two adjacent through-holes corresponding to different photosensitive elements is denoted by L1;
    a distance between the surface of the transparent cover opposing to the photosensitive layer and a surface of the light-guiding layer facing the transparent cover is denoted by a;
    a thickness of the light-guiding layer is denoted by h; and $$h \geq \frac{2ad}{L1-d}.$$

2. The pattern identification device of claim 1, wherein each of the plurality of light-transmitting portions comprises an optical fiber.

3. The pattern identification device of claim 1, wherein a maximum distance of center points of two adjacent through-holes in a row or a column and corresponding to a same photosensitive element is denoted by L2, and L2<L1.

4. The pattern identification device of claim 3, wherein:
    each photosensitive element corresponds to nine through-holes arranged in a 3×3 array;
    distances between center points of any two adjacent through-holes in a row or column of the 3×3 array are substantially equal; and
    distances between center points of any two adjacent through-holes corresponding to difference photosensitive elements and in a row or in a column are substantially equal.

5. The pattern identification device of claim 4, wherein:
    a diameter of the circular cross-section of each through-hole is about 3.0-4.2 µm;
    the distance between the center points of two adjacent through-holes corresponding to different photosensitive elements and in a column or in a row is in a range of about 17.8-35.1 µm;
    the distance between the surface of the transparent cover opposing to the photosensitive layer and the surface of the light-guiding layer facing the transparent cover is about 900-1060 µm; and
    a thickness of the light-guiding layer is in a range of about 174.5-498.5 µm.

6. The pattern identification device of claim 4, wherein:
    a diameter of the circular cross-section of each through-hole is about 6.0-7.4 µm;
    the distance between the center points of two adjacent through-holes corresponding to different photosensitive elements and in a column or in a row is in a range of about 33.0-35.9 µm;
    the distance between the surface of the transparent cover opposing to the photosensitive layer and the surface of the light-guiding layer facing the transparent cover is about 900-1060 µm; and
    a thickness of the light-guiding layer is in a range of about 423.7-498.5 µm.

7. The pattern identification device of claim 3, wherein:
    each photosensitive element corresponds to twenty-five through-holes arranged in a 5×5 array;
    distances between center points of any two adjacent through-holes in a row or in a column of the 5×5 array are substantially equal; and
    distances between center points of any two adjacent through-holes corresponding to difference photosensitive elements and in a row or in a column are substantially equal.

8. The pattern identification device of claim 7, wherein:
    a diameter of the circular cross-section of each through-hole is about 4.50-5.80 µm;

a distance between the center points of two adjacent through-holes corresponding to different photosensitive elements and in a column or in a row is in a range of about 25.4-29.0 μm;

a distance between the surface of the transparent cover opposing to the photosensitive layer and the surface of the light-guiding layer facing the transparent cover is about 900-1060 μm; and a thickness of the light-guiding layer is in a range of about 423.7-498.5 μm.

9. The pattern identification device of claim 1, wherein the pattern comprises at least one of a fingerprint, and a palm print, or a facial feature.

10. A display apparatus, comprising a pattern identification device according to claim 1.

11. The display apparatus of claim 10, further comprising a display panel, wherein:

the display panel is disposed over the light-guiding layer and below the first surface, with a light-emitting side and a non-light-emitting side thereof facing the first surface and the light-guiding layer, respectively; and the display panel is configured such that a portion thereof positionally corresponding to each of the plurality of photosensitive elements is light-transmissive such that lights from the display panel can, upon reflection by the pattern over the first surface, transmit through the portion of the display panel to reach the each of the plurality of photosensitive elements.

12. The display apparatus of claim 11, wherein the display panel is an OLED display panel.

13. The display apparatus of claim 11, wherein the portion of the display panel comprises at least one transparent pixel electrode allowing the portion to be light-transmissive.

14. The display apparatus of claim 13, wherein the portion of the display panel comprises one transparent pixel electrode.

15. The display apparatus of claim 13, wherein the portion of the display panel comprises more than one transparent pixel electrode.

16. The display apparatus of claim 11, wherein the portion of the display panel is provided with at least one second through-hole allowing the portion to be light-transmissive.

17. The display apparatus of claim 11, further comprising a transparent cover disposed between the light-guiding layer and the first surface, wherein:

the transparent cover is common to both the display panel and the pattern identification device; and the photosensitive layer and the light-guiding layer of the pattern identification device are arranged across a whole screen of the display apparatus.

* * * * *